(12) United States Patent
Blauvelt

(10) Patent No.: US 10,587,094 B2
(45) Date of Patent: Mar. 10, 2020

(54) WAVELENGTH-STABILIZED SEMICONDUCTOR LASER SOURCE

(71) Applicant: EMCORE Corporation, Alhambra, CA (US)

(72) Inventor: Henry A. Blauvelt, San Marino, CA (US)

(73) Assignee: Emcore Corporation, Alhambra, CA (US)

( * ) Notice: Subject to any disclaimer, the term of this patent is extended or adjusted under 35 U.S.C. 154(b) by 0 days.

(21) Appl. No.: 16/143,501

(22) Filed: Sep. 27, 2018

(65) Prior Publication Data
US 2019/0097385 A1    Mar. 28, 2019

Related U.S. Application Data

(60) Provisional application No. 62/563,644, filed on Sep. 27, 2017.

(51) Int. Cl.
| | |
|---|---|
| *H01S 3/06* | (2006.01) |
| *H01S 5/0625* | (2006.01) |
| *H01S 5/026* | (2006.01) |
| *G02F 1/01* | (2006.01) |
| *H01S 5/00* | (2006.01) |

(Continued)

(52) U.S. Cl.
CPC .......... *H01S 5/0265* (2013.01); *G02F 1/0121* (2013.01); *H01S 5/0085* (2013.01); *H01S 5/06258* (2013.01); *H01S 5/06832* (2013.01); *H01S 5/06251* (2013.01); *H01S 5/1203* (2013.01)

(58) Field of Classification Search
CPC .. H01S 5/0265; H01S 5/0085; H01S 5/06251; H01S 5/06832; H01S 5/06258; H01S 5/1203; G02F 1/0121
See application file for complete search history.

(56) References Cited

U.S. PATENT DOCUMENTS

| | | | | |
|---|---|---|---|---|
| 5,642,371 A | * | 6/1997 | Tohyama | B82Y 20/00 372/20 |
| 5,898,719 A | * | 4/1999 | Ryu | H01S 5/0687 372/31 |

(Continued)

OTHER PUBLICATIONS

Barrios et al; Tunable Silicon Fabry-Perot microcavity; Conference for Lasers and Electrooptics; CThMM1; 2004.

(Continued)

*Primary Examiner* — Yuanda Zhang
(74) *Attorney, Agent, or Firm* — David S. Alavi

(57) ABSTRACT

A semiconductor laser source includes a partial-grating DFB laser with two laser electrodes, one over the grating and the other between the grating and one end of the laser. Constant laser currents flow into the waveguide through the electrodes (typically different from each other) and produce laser output. A wavelength discriminator, an optical detector, and a wavelength-control circuit act as a wavelength-control feedback mechanism to generate a wavelength control current that flows through one laser electrode or the other, or through both electrodes with opposite polarities. Phase noise on the laser output can be reduced at modulation frequencies exceeding several hundred kHz up to one or several tens of MHz or more. The laser-wavelength can be swept while exhibiting reduced phase noise.

34 Claims, 14 Drawing Sheets

(51) Int. Cl.
*H01S 5/0683* (2006.01)
*H01S 5/12* (2006.01)

(56) References Cited

U.S. PATENT DOCUMENTS

| | | |
|---|---|---|
| 9,059,801 B1 | 6/2015 | Blauvelt et al. |
| 9,306,372 B2 | 4/2016 | Blauvelt et al. |
| 9,306,672 B2 | 4/2016 | Blauvelt et al. |
| 9,438,007 B2 | 9/2016 | Blauvelt et al. |
| 9,564,733 B2 | 2/2017 | Blauvelt et al. |
| 9,564,734 B2 | 2/2017 | Blauvelt et al. |
| 10,074,959 B2 | 9/2018 | Blauvelt et al. |
| 2005/0254743 A1* | 11/2005 | Akiyama ............... B82Y 20/00 385/3 |
| 2010/0246614 A1* | 9/2010 | Koshi ................... H01S 5/0683 372/20 |
| 2011/0233379 A1* | 9/2011 | Sekiguchi ............... H01S 5/026 250/201.9 |
| 2014/0177659 A1* | 6/2014 | Goobar ............... H01S 5/06817 372/20 |
| 2016/0276803 A1* | 9/2016 | Uesaka ............... H01S 5/06817 |
| 2018/0269981 A1 | 9/2018 | Blauvelt |

OTHER PUBLICATIONS

Chang et al; Electro-optic analog-to-digital converter using channel waveguide Fabry-Perot modulator array; Applied Physics Letters 43(1) 22; Jul. 1, 1993.
Ishida et al; Multielectrode DBR laser diode for wide bandwidth and flat FM response; Electronics Letters 25(11) 703; May 25, 1989.
Jahan et al; Titanium-Indiffused Lithium Niobate Waveguide Fabry-Perot Modulator; USC McNair Summer Research Program; 2009.
Kobtsev et al; Ultra-narrow-linewidth combined CW Ti:Sapphire/Dye laser for atom cooling and high-precision spectroscopy; Proc SPIE vol. 6451 64511U; 2007.
Kobtsev et al; Combined single-frequency ring dye/Ti:sapphire laser; Quantum Electronics 36(12) 1148; 2006.
Kourogi et al; A 250 Hz Spectral Linewidth 1.5 um MQW-DFB Laser Diode with Negative-Electrical-Feedback; IEEE Photonics Technology Letters 3(6) 496; Jun. 6, 1991.
Suzuki et al; Optical waveguide Fabry-Perot modulators in LiNbO3; Applied Optics 33(6) 1044; Feb. 20, 1994.
Yoshikuni et al; Multielectrode Distributed Feedback Laser for Pure Frequency Modulation and Chirping SUppressed Amplitude Modulation; J Lightwave Tech LT-5(4) 516; Apr. 1987.

* cited by examiner

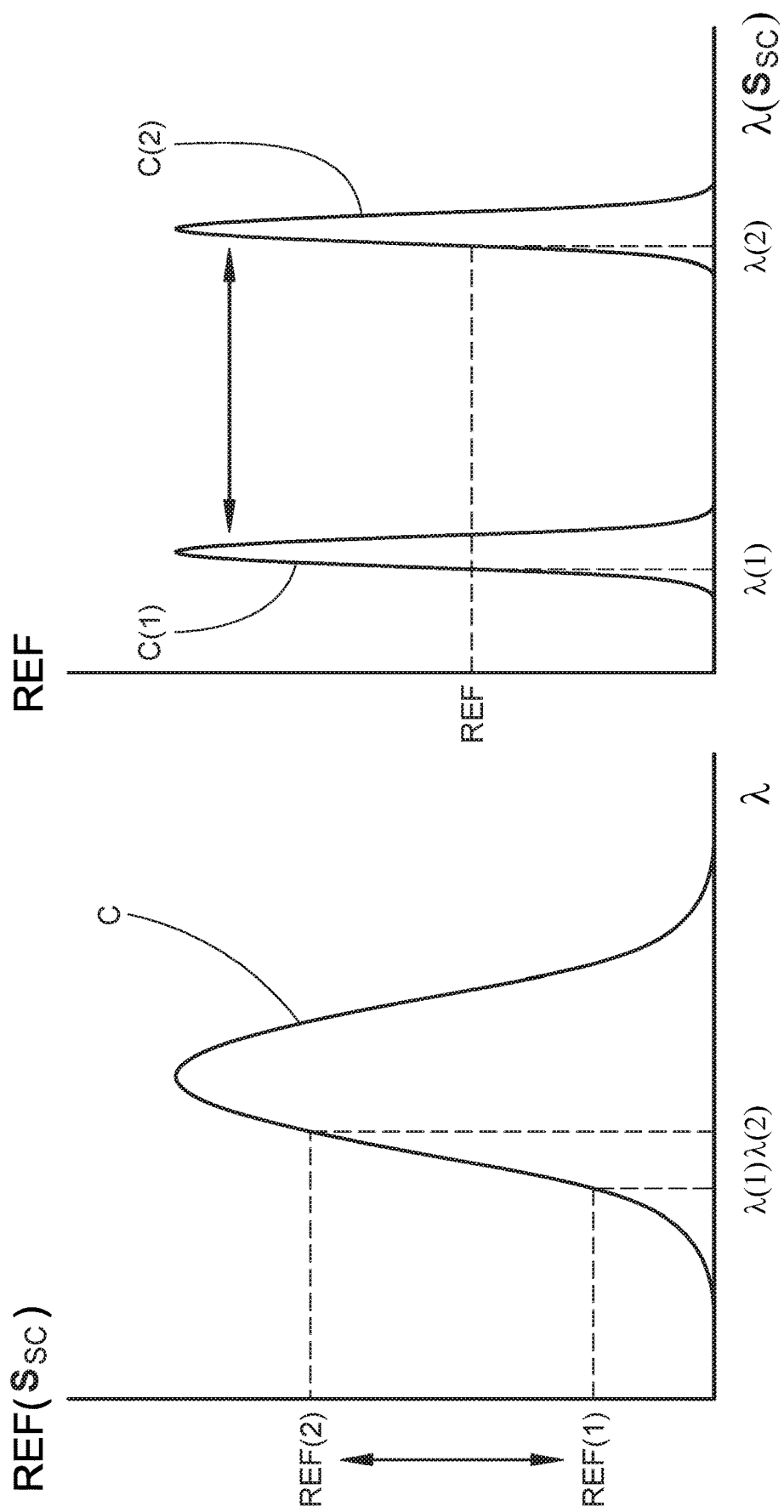

WAVELENGTH-STABILIZED SEMICONDUCTOR LASER SOURCE

BENEFIT CLAIMS TO RELATED APPLICATIONS

This application claims benefit of U.S. provisional App. No. 62/563,644 filed Sep. 27, 2017 in the name of Henry A. Blauvelt, said provisional application being hereby incorporated by reference as if fully set forth herein.

FIELD OF THE INVENTION

The field of the present invention relates to laser sources. In particular, wavelength-stabilized semiconductor laser sources, and methods for fabrication and operation thereof, are disclosed herein.

BACKGROUND

A variety of semiconductor laser sources, laser modulators, or frequency stabilizers are disclosed in:

U.S. Pat. No. 9,059,801 issued 16 Jun. 2015 in the names of Henry A. Blauvelt, Xiaoguang He, and Kerry Vahala;
U.S. Pat. No. 9,306,372 issued 5 Apr. 2016 in the names of Henry A. Blauvelt, Xiaoguang He, and Kerry Vahala;
U.S. Pat. No. 9,306,672 issued 5 Apr. 2016 in the names of Henry A. Blauvelt, Xiaoguang He, and Kerry Vahala;
U.S. Pat. No. 9,438,007 issued 6 Sep. 2016 in the names of Henry A. Blauvelt, Xiaoguang He, and Kerry Vahala;
U.S. Pat. No. 9,564,733 issued 7 Feb. 2017 in the names of Henry A. Blauvelt, Xiaoguang He, and Kerry Vahala;
U.S. Pat. No. 9,564,734 issued 7 Feb. 2017 in the names of Henry A. Blauvelt, Xiaoguang He, and Kerry Vahala;
U.S. Pat. No. 10,074,959 issued 11 Sep. 2018 in the names of Henry A. Blauvelt, Xiaoguang He, and Kerry Vahala;
WO 2016/044258 published 24 Mar. 2016 in the names of Henry A. Blauvelt, Xiaoguang He, and Kerry Vahala;
WO 2018/027058 published 8 Feb. 2018 in the names of Henry A. Blauvelt, Xiaoguang He, and Kerry Vahala;
Chang et al; Electro-optic analog-to-digital converter using channel waveguide Fabry-Perot modulator array; Appl Phys. Lett. 43(1) p 22 (1983);
Yoshikuni et al; Multielectrode Distributed Feedback Laser for Pure Frequency Modulation and Chirping Suppressed Amplitude Modulation; J. Lightwave Tech. LT-5(4) p 516 (1987);
Ishida et al; Multielectrode DBR laser diode for wide bandwidth and flat FM response; Electron. Lett. 25(11) p 703 (1989);
Kourogi et al; A 250 Hz Spectral Linewidth 1.5 μm MQW-DFB Laser Diode with Negative-Electrical-Feedback; IEEE Photon. Tech. Lett. 3(6) p 496 (1991);
Suzuki et al; Optical waveguide Fabry-Perot modulators in LiNbO$_3$; Appl. Optics 33(6) p 1044 (1994);
Barrios et al; Tunable Silicon Fabry-Perot microcavity; Conference on Lasers and Electrooptics CThMM1 (2004);
Kobtsev et al; Combined cw single-frequency ring dye/Ti:sapphire laser; Quant. Electron. 36(12) p 1148 (2006);
Kobtsev et al; Ultra-narrow-linewidth combined CW Ti:sapphire/Dye laser for atom cooling and high-precision spectroscopy; Solid Date Lasers XVI: Technology and Devices, Hoffman et al Eds; Proc SPIE 6451 6451U (2007); and
Jahan and Takahashi; Titanium-Indiffused Lithium Niobate Waveguide Fabry-Perot Modulator; University of Southern California McNair Summer Research Program (2009).

Each of the preceding patents, applications, or publications is incorporated by reference as if fully set forth herein, and are referred to collectively herein as "the incorporated references" or "the references incorporated in the background."

SUMMARY

An inventive semiconductor laser source includes a laser resonator formed on a semiconductor substrate. The laser resonator is defined by an optical waveguide, an optical reflector, and a waveguide grating. The waveguide provides position-dependent optical gain or loss, for an optical signal that propagates along the waveguide within an operating wavelength range of the laser source, that varies according to a position-dependent level of electrical current density flowing into or out of the optical waveguide. Laser output from the laser resonator is characterized by a laser wavelength and propagates (i) in a forward direction from the grating along the waveguide, (ii) in a rearward direction from the optical reflector, or (iii) in both directions. A first laser electrode is positioned over a first segment of the waveguide between the reflector and the grating, and a substantially constant first laser current $I_1$ flows through the first laser electrode into the first segment of the waveguide; a second laser electrode is positioned over a second segment of the waveguide that includes the grating, and a substantially constant second laser current $I_2$ flows through the second laser electrode into the second segment of the waveguide.

The inventive laser source further includes an optical detector, a wavelength discriminator, and a laser-control circuit. The wavelength discriminator directs a wavelength-dependent fraction of the laser output onto the optical detector, which generates a laser-wavelength electrical signal. The laser-control electrical circuit couples the optical detector and one or both of the laser electrodes in a feedback arrangement operative to control and stabilize the laser wavelength relative to a wavelength-dependent property of the wavelength discriminator. The laser-control electrical circuit (i) derives from the laser-wavelength electrical signal a wavelength-control current $I_{WC}$, (ii) directs the first laser current $I_1$ to flow through the first laser electrode, (iii) directs the second laser current $I_2$ to flow through the second laser electrode, and (iv) directs the wavelength-control current $I_{WC}$ to flow through one or both of the laser electrodes.

An inventive method for operating the inventive laser source comprises: (A) applying the first laser current $I_1$ to the first segment of the waveguide through the first laser electrode and applying the second laser current $I_2$ to the second segment of the waveguide through the second laser electrode, thereby producing the laser output to propagate along the waveguide; and (B) operating the laser-control electrical circuit so as to direct the wavelength-control current $I_{WC}$ to flow through one or both of the first or second laser electrodes and thereby control and stabilize the laser wavelength.

One or both of the wavelength discriminator or the laser-control circuit can be arranged so as to sweep the laser wavelength. An inventive method for operating such an inventive laser source comprises: (A) applying the first laser current $I_1$ to the first segment of the waveguide through the first laser electrode and applying the second laser current $I_2$ to the second segment of the waveguide through the second laser electrode, thereby producing the laser output to propagate along the waveguide; and (B) operating the wavelength discriminator or the laser-control electrical circuit so as to direct the wavelength-control current $I_{WC}$ to flow through one or both of the first or second laser electrodes and thereby control, stabilize, and sweep the laser wavelength.

Objects and advantages pertaining to wavelength-stabilized semiconductor laser sources may become apparent upon referring to the example embodiments illustrated in the drawings and disclosed in the following written description or appended claims.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

FIGS. 7A and 7B illustrate schematically examples of wavelength sweep control by sweeping a reference signal level or by sweeping wavelength-dependence of a wavelength discriminator, respectively.

The embodiments depicted are shown only schematically: all features may not be shown in full detail or in proper proportion, certain features or structures may be exaggerated relative to others for clarity, and the drawings should not be regarded as being to scale. The embodiments shown are only examples: they should not be construed as limiting the scope of the present disclosure or appended claims.

DETAILED DESCRIPTION OF EMBODIMENTS

Figure 2A:
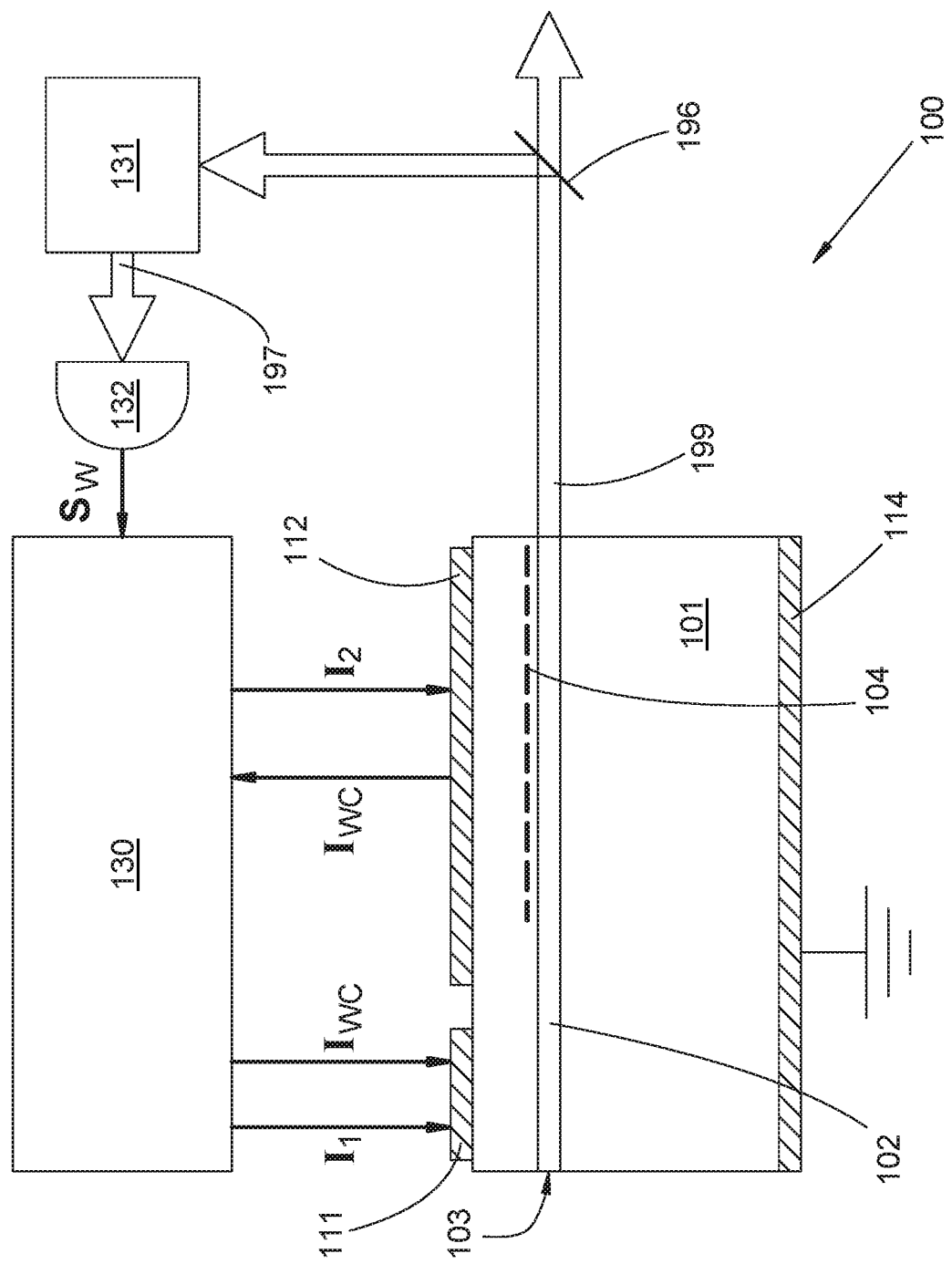
Figure 2B:
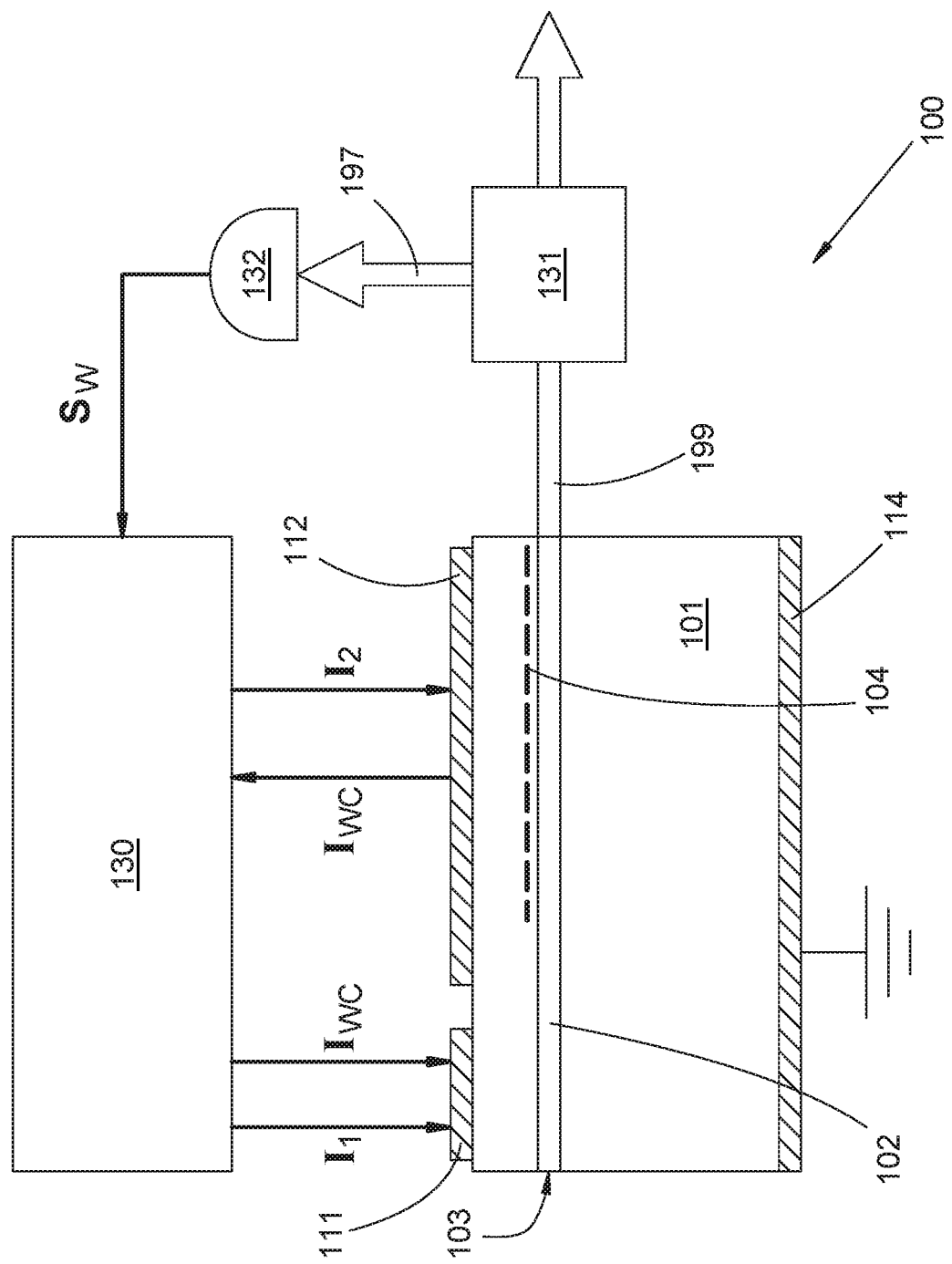
Figure 3A:
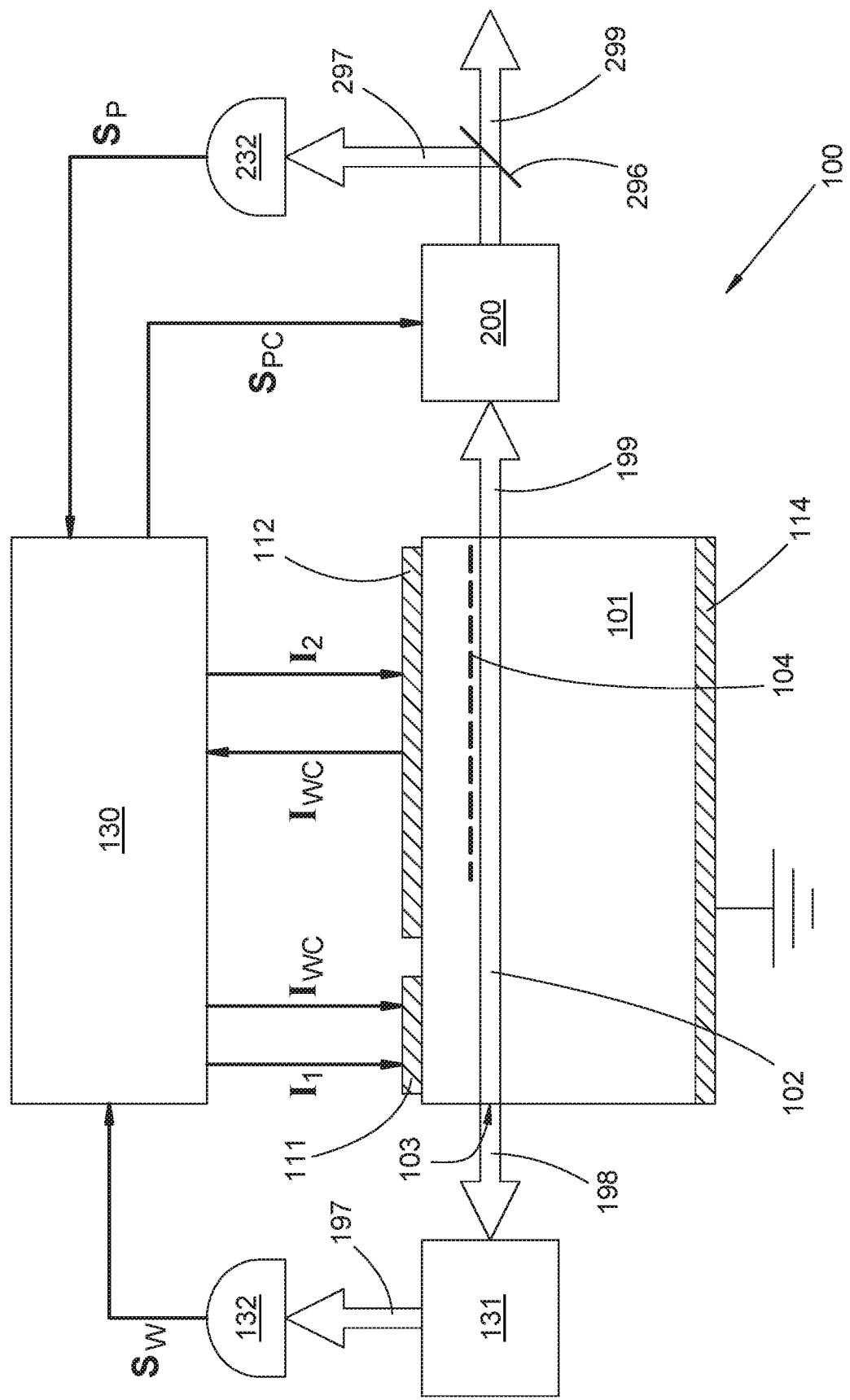
FIGS. 3A, 3B, and 4 illustrate schematically examples of inventive laser sources with wavelength and power stabilization.
Figure 3B:
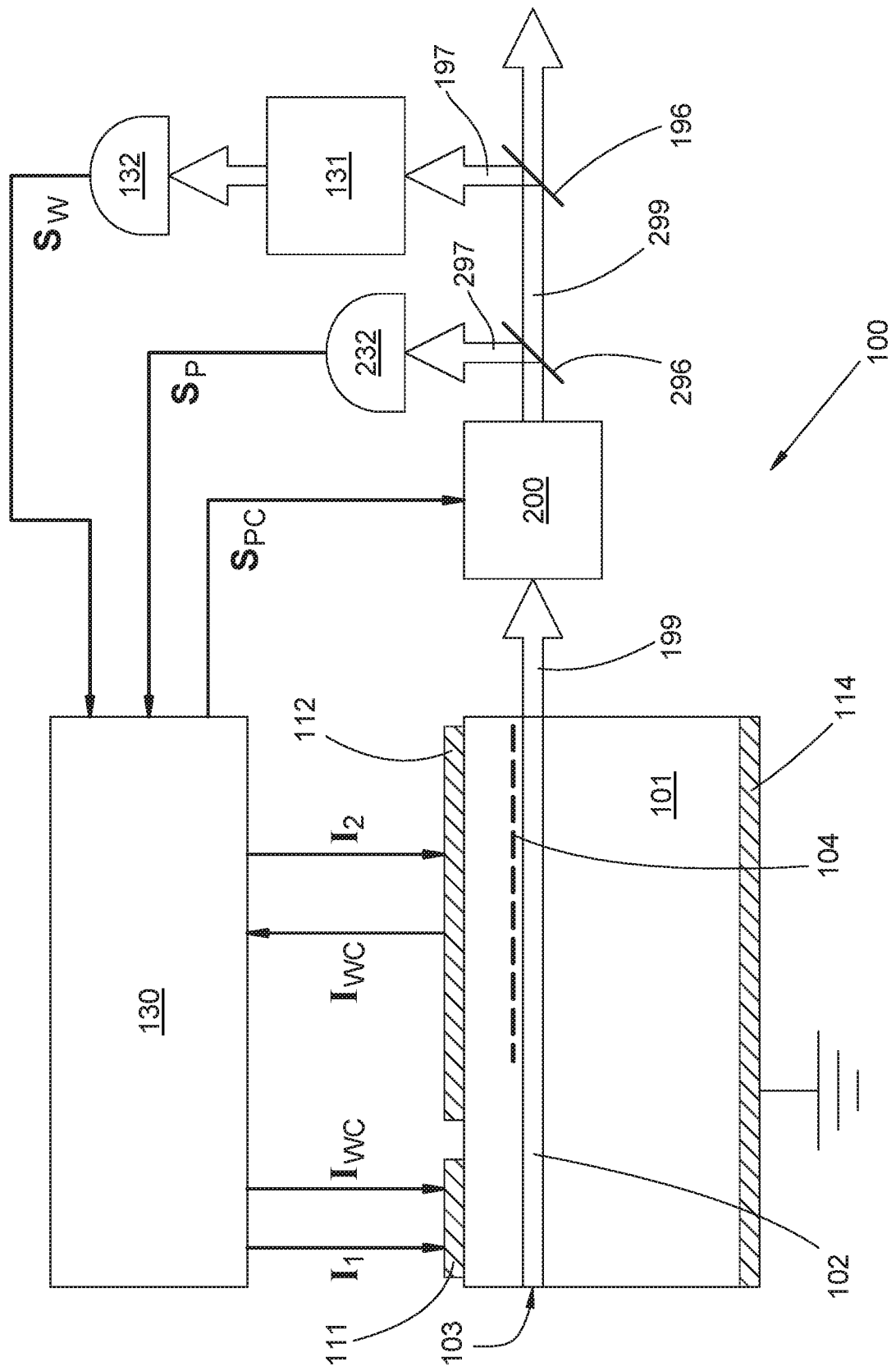
Figure 4:
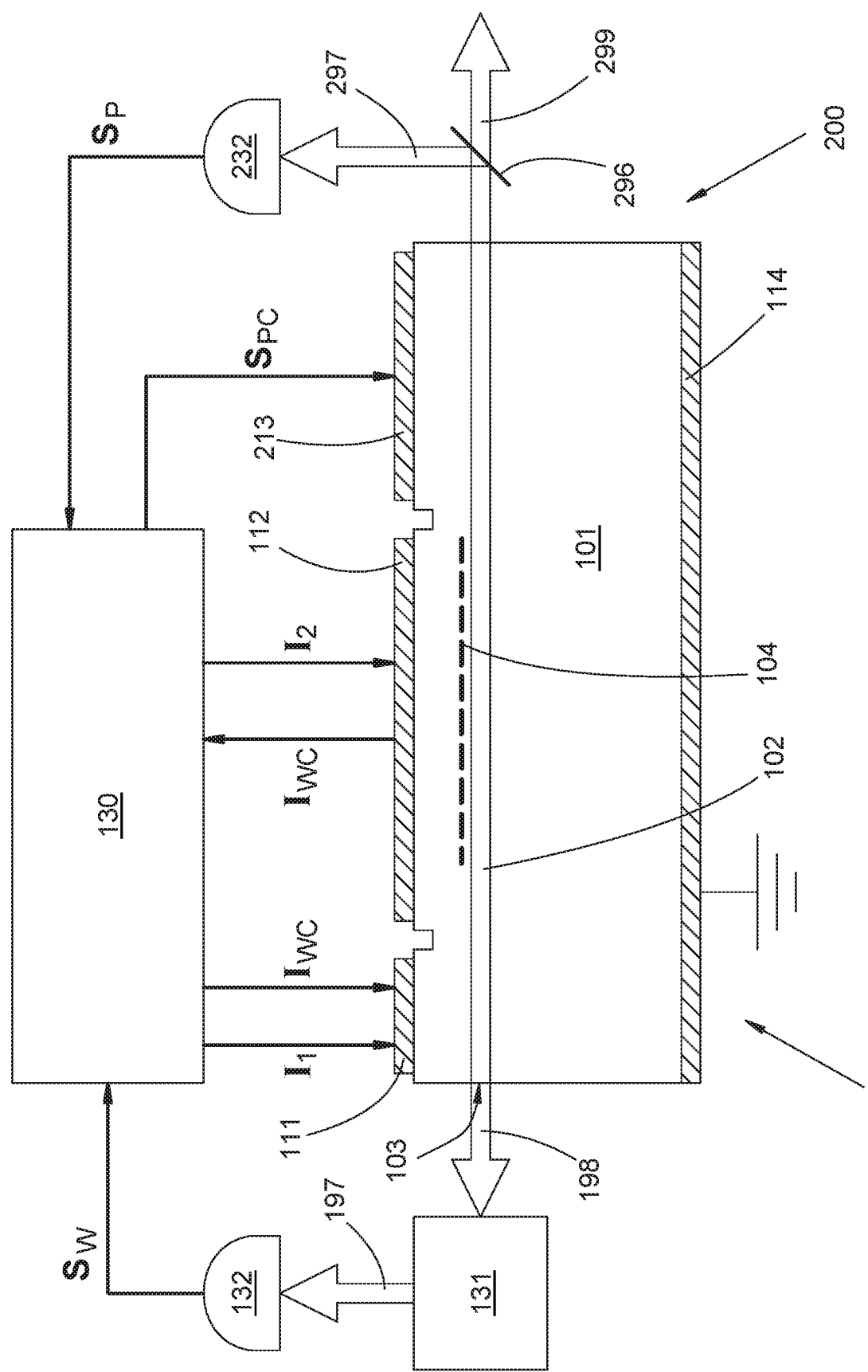
Figure 6A:
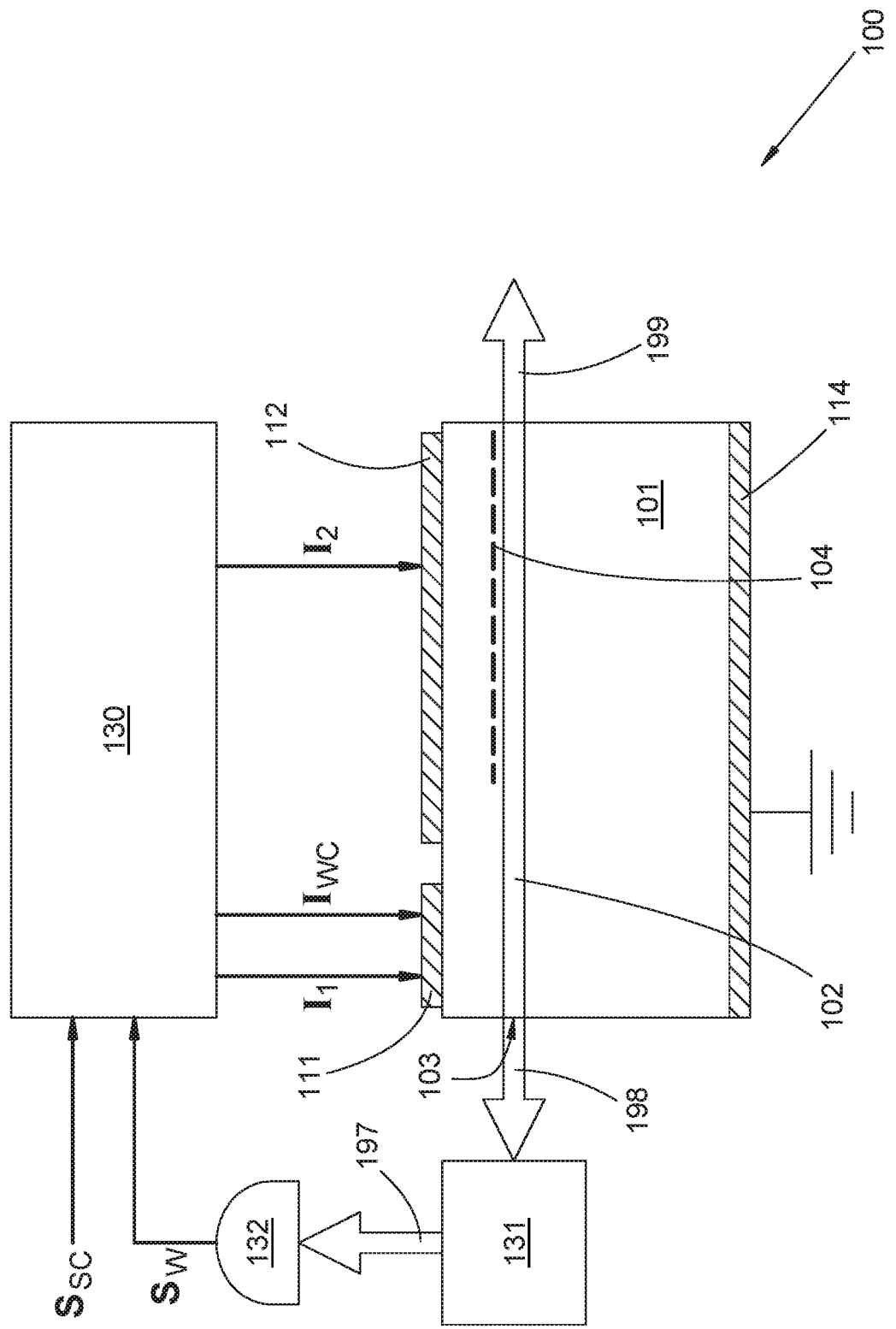
FIGS. 6A and 6B illustrate schematically examples of inventive laser sources with wavelength stabilization and wavelength sweep control.
Figure 6B:
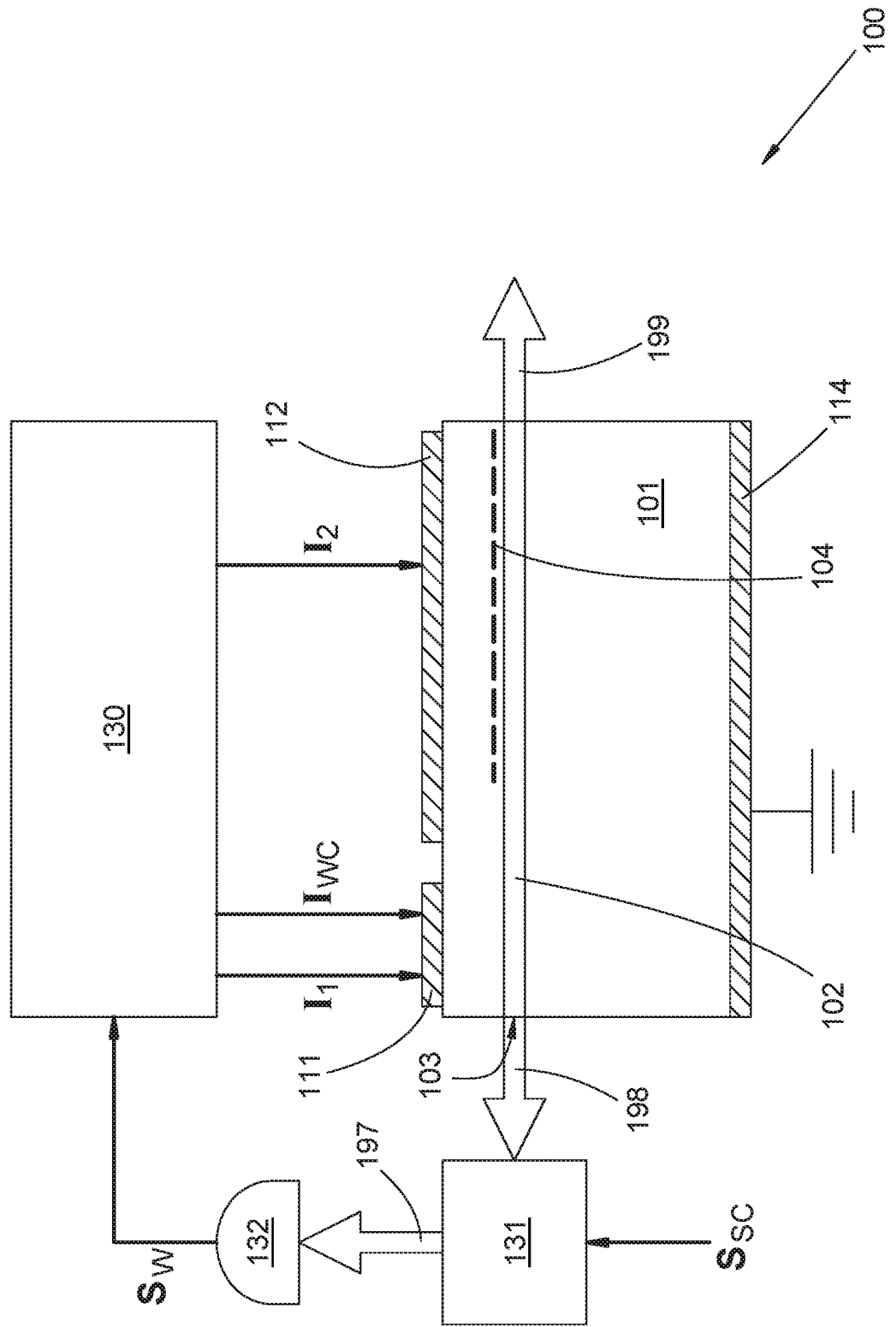

Various example embodiments of various inventive semiconductor laser sources 100 are illustrated schematically in FIGS. 1A-1D, 2A, 2B, 3A, 3B, 4, 6A, and 6B. Each example semiconductor laser source 100 comprises: an optical waveguide 102 formed on a semiconductor substrate 101; an optical reflector 103 and an optical grating 104; first and second laser electrodes 111 and 112; a wavelength discriminator 131 and an optical detector 132; and a laser-control circuit 130. The examples of FIGS. 3A-3C and 4 further include an optical modulator 200, a second optical detector 232, and a power-control circuit (typically incorporated into the laser-control circuit 130). In the example of FIG. 4, the optical modulator 200 is integrated onto the substrate 101 with the semiconductor laser source 100, and includes a segment of the waveguide 102. In the examples of FIGS. 6A and 6B, the laser source 100 is arranged to sweep the laser wavelength.

The waveguide 102 can be of any suitable type or arrangement, and can include one or more upper or lower cladding layers or core layers in addition to one or more active layers. The one or more active layers of the waveguide 102 provide position-dependent optical gain or loss for an optical signal within an operating wavelength range of the laser source that propagates along the waveguide 102. Note that the phrase "propagating along the waveguide" means that the waveguide supports one or more propagating optical modes, and that the optical signal propagates in one or more of those supported modes. The position-dependent optical gain or loss varies according to a position-dependent level of electrical current density flowing into or out of the optical waveguide 102. Any operating wavelength range can be employed; operating wavelengths in the visible and near IR portions of the electromagnetic spectrum are common for fiber-optic telecommunications applications or LIDAR applications for which semiconductor laser sources are often employed. The substrate 101 and waveguide 102 can comprise any suitable semiconductor materials, which typically are at least partly dictated by the desired operating wavelength range. Common semiconductor laser sources operate in the visible or near IR (e.g., between about 400 nm and about 2500 nm); common wavelength ranges employed in the near IR include, e.g., between about 800 nm and about 900 nm, between about 1200 nm and about 1700 nm, between about 1520 nm and about 1570 nm, or between about 1570 nm and about 1620 nm. For operating at such wavelengths, indium phosphide (InP; doped or undoped) is a common material for the substrate 101, and various III-V semiconductor materials or alloys thereof (e.g., InP, GaAs, InGaAs, InGaAsP, InAlGaAs, and so forth; often arranged as one or more heterostructures or quantum well structures) are commonly employed to form the waveguide 102. Any suitable semiconductor materials can be employed, for use over any suitable operating wavelength range.

One end face (arbitrarily designated as the rear end face) of the substrate 101 and the waveguide 102 can be arranged as a reflective surface, and can be formed in any suitable way (e.g., cleaving, cutting, etching, polishing, and so forth). The reflective surface exhibits relatively high optical reflectivity and acts as the optical reflector 103. Over at least the operating wavelength range, an optical signal, propagating along the waveguide 102 in a rearward direction (i.e., toward the optical reflector 103), is at least partly reflected by the optical reflector 103. The reflected portion of the optical signal propagates along the waveguide 102 in a forward direction (i.e., away from the optical reflector 103). In some instances index contrast between the substrate 101 and its surroundings can provide sufficient reflectivity via Fresnel reflection; in other instances a suitable reflective coating can be applied to the reflective end face (e.g., metal, dielectric, multilayer, and so forth). Other suitable reflector types can be employed, including those not necessarily formed on the end face of the substrate 101 or waveguide 102 (e.g., a broadband Bragg reflector formed in the waveguide 102).

An optical grating 104 is formed or arranged on the substrate 101 or the waveguide 102 in any suitable way (e.g., by spatially selective densification, doping, deposition, etching, or other processing of one or more layers of the waveguide 102 or on the substrate 101) to form a periodic variation of modal index along the length of the grating 104, which acts as a Bragg grating. A segment of the waveguide 102 remains between the optical reflector 103 and a rearward end of the optical grating 104. The optical grating 104 diffracts, over at least a portion of the operating wavelength range, at least a portion of an optical signal propagating along the waveguide 102 in the forward direction. The diffracted portion propagates in the rearward direction along the waveguide 102 toward the optical reflector 103. A resonator segment of the waveguide 102 (i.e. forward of the reflector 103 and extending as far as the forward end of the grating 104), the optical reflector 103, and the optical grating 104 therefore define a partial-grating distributed feedback (DFB) laser resonator. Laser output from the laser resonator is characterized by a laser wavelength and propagates (i) in the forward direction from the grating along the grating 104 (i.e., as the forward-propagating laser output 199), (ii) in the rearward direction from the optical reflector 103 (i.e., as the rearward-propagating laser output 198), or (iii) in both directions. In the examples shown, the desired, usable output of the laser source 100 is derived from the forward-propagating laser output 199, however, this need not be the case; in other examples (not shown), the usable output of the laser source 100 can be derived from the rearward-propagating laser output 198.

A first laser electrode 111 is positioned over at least a portion, of length $L_1$, of the resonator segment of the waveguide 102 that lies between the optical reflector 103 and the rearward end of the optical grating 104; typically, no portion of the grating 104 lies below the first laser electrode 111. The first laser electrode 111 is arranged so as to enable a substantially constant first laser current $I_1$ to flow through the laser electrode 111 into the resonator segment of the waveguide 102 and produce optical gain therein. A second laser electrode 112 is positioned over at least a portion, of length $L_2$, of the resonator segment of the waveguide 102 that includes at least a portion of the grating 104; typically, the entire grating 104 lies below the second laser electrode 112. The second laser electrode 112 is arranged so as to enable a substantially constant laser current $I_2$ to flow through the second laser electrode 112 into the resonator segment of the waveguide 102 and produce optical gain therein. The electrode 114 on the bottom of the substrate 101 is employed to complete the conduction path for the laser currents $I_1$ and $I_2$. The electrode 114 typically is grounded, as in the examples shown; the electrode 114 is not necessarily grounded in other examples (not shown). In some examples, a current density $I_1/L_1$ differs from a current density $I_2/L_2$. In some examples, such differing current densities can be adjusted in various ways to yield one or more desirable performance characteristics of the laser source 100 (described further below).

During operation of the laser source 100, one or both of the current $I_1$ or the current $I_2$ are sufficiently large so that the optical gain they produce exceeds the lasing threshold of the resonator defined by the waveguide 102, the reflector 103, and the grating 104, resulting in the one or both of the forward-propagating laser output 199 or the rearward-propagating laser output 198 (both characterized by the laser wavelength).

Figure 1A:
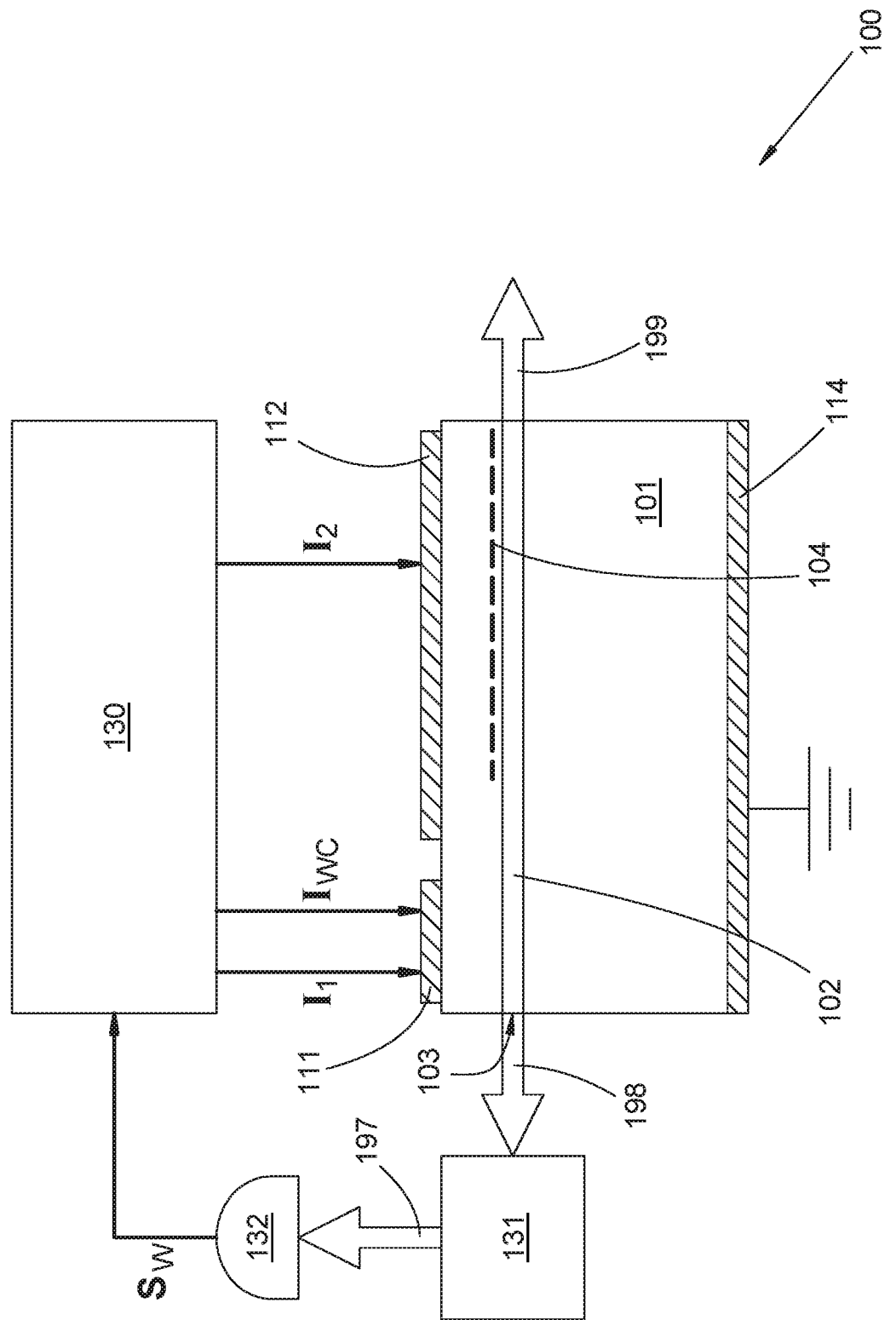
FIGS. 1A-1D, 2A, and 2B illustrate schematically examples of inventive laser sources with wavelength stabilization.
Figure 1B:
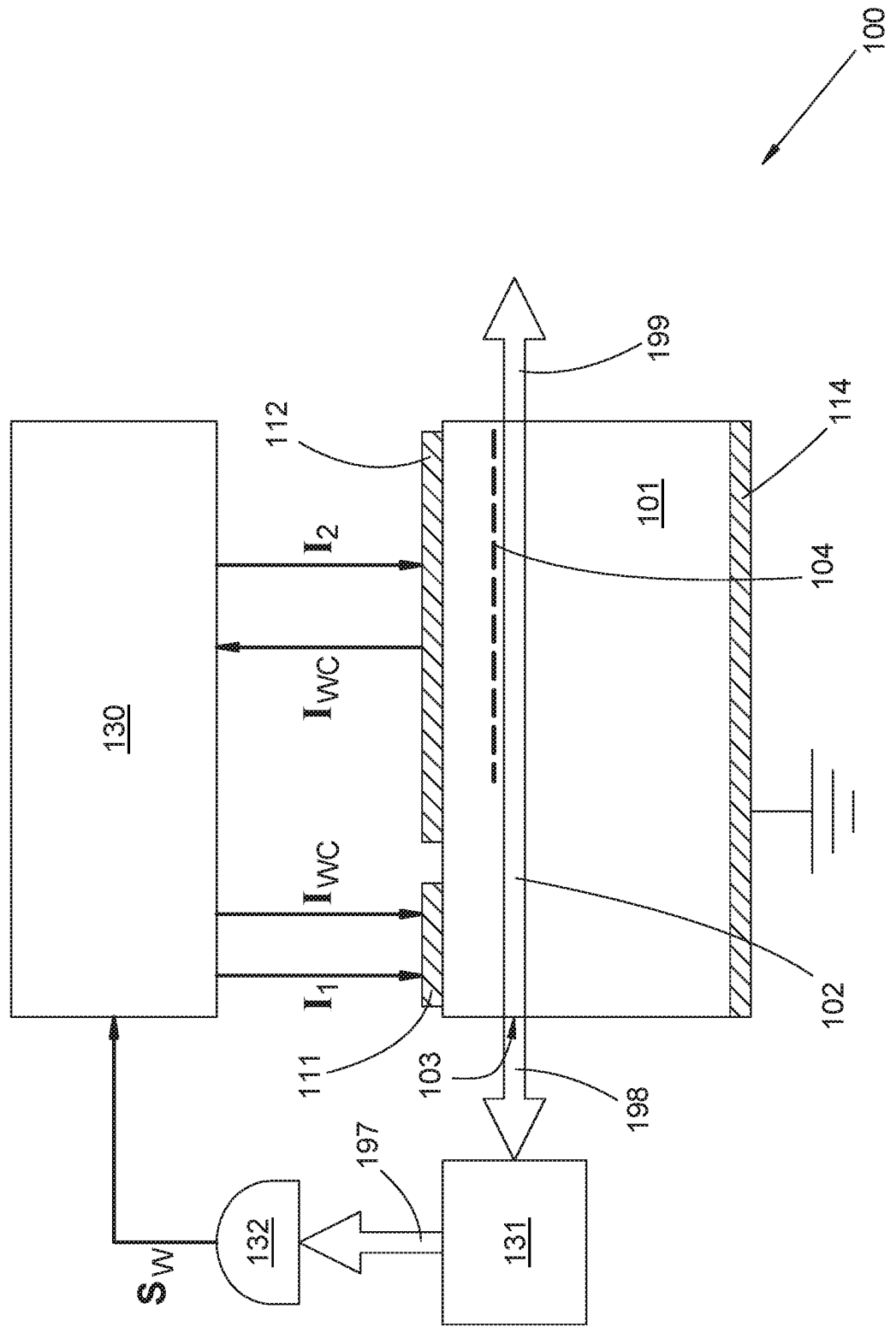
Figure 1C:
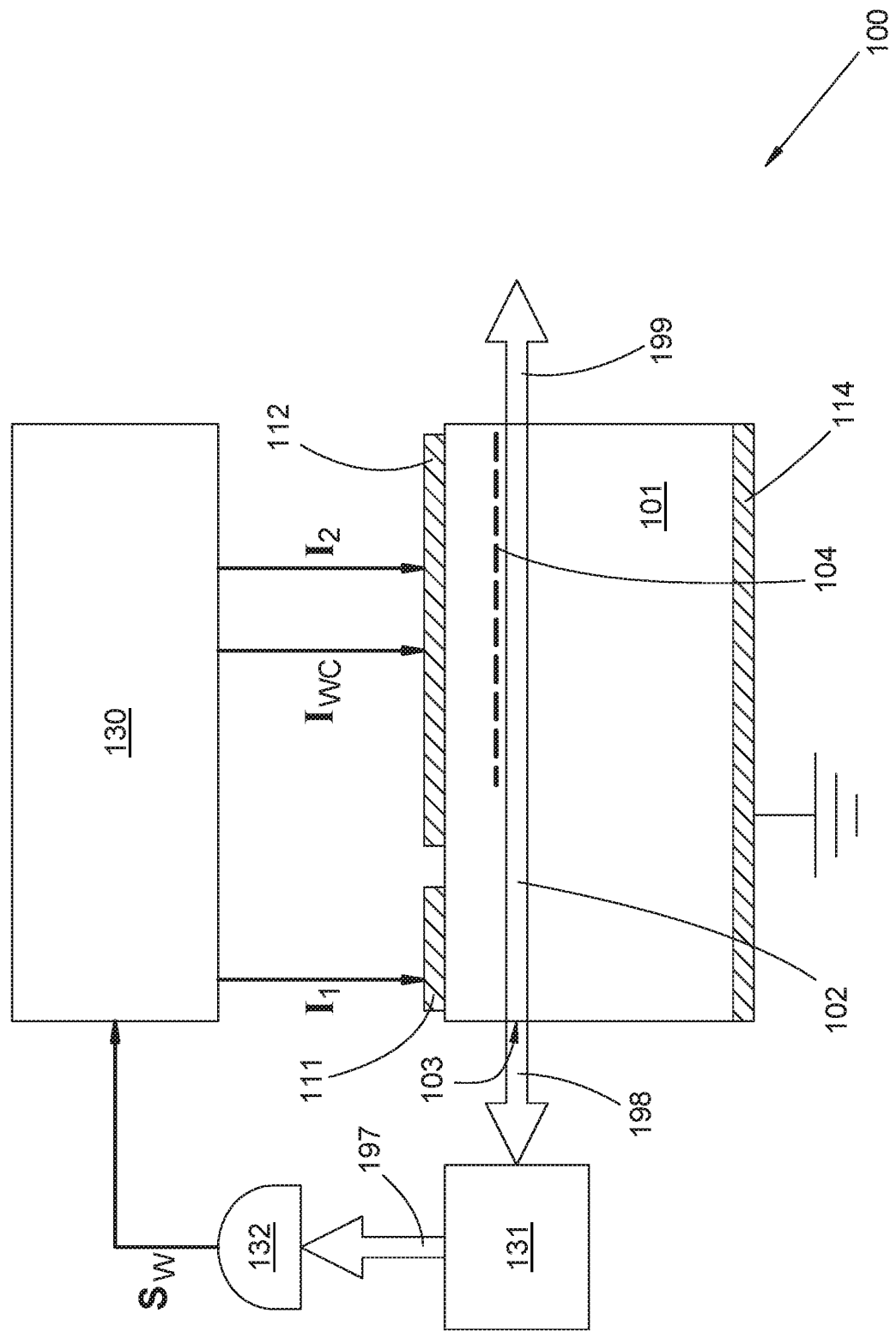
Figure 1D:
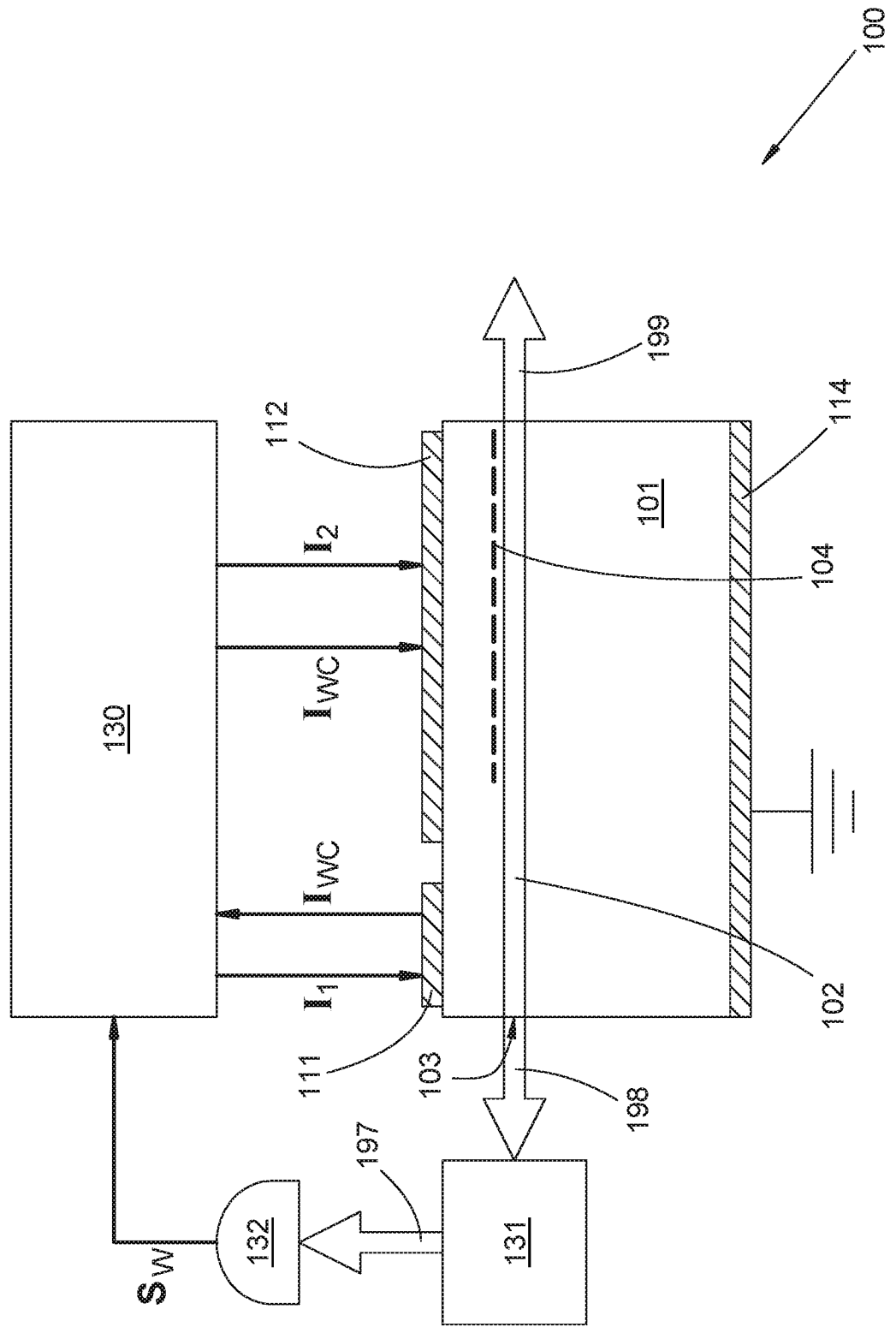

An inventive laser source 100 further includes an optical detector 132, a wavelength discriminator 131, and a laser-control electrical circuit 130. The wavelength discriminator 131 is arranged so as to direct a wavelength-dependent fraction 197 of the laser output. The wavelength-dependent fraction 197 is derived from the rearward-propagating laser output 198 in the examples of FIGS. 1A-1D, 3A, 3B, 4, 6A, and 6B. In FIGS. 2A and 2B, the wavelength-dependent fraction 197 is derived from the forward-propagating laser output 199 (using a beamsplitter 196 to direct only a portion of the forward propagating laser output 199 to the wavelength discriminator 131 in the example of FIG. 2A; receiving the entire forward-propagating laser output 199 at the wavelength discriminator 131 and directing a wavelength-dependent fraction 197 to the optical detector 132 in the Example of FIG. 2B). The wavelength discriminator 131 directs the wavelength-dependent fraction 197 of the laser output onto the optical detector 132 so as to generate therefrom a laser-wavelength electrical signal $S_W$. The laser-control electrical circuit 130 couples the optical detector 132 and one or both of the first or second laser electrodes 111/112 in a feedback arrangement operative to control and stabilize the laser wavelength relative to a wavelength-dependent property of the wavelength discriminator 131. During operation, the laser-control electrical circuit 130 derives from the laser-wavelength electrical signal $S_W$ a wavelength-control current $I_{WC}$, and directs that current $I_{WC}$ to flow through one or both of the laser electrodes 111/112 (as described further below). The laser-control circuit also directs the first laser current $I_1$ to flow through the first laser electrode 111 and directs the second laser current $I_2$ to flow through the second laser electrode 112. Although referred to and depicted as a single circuit, the laser-control circuit 130 can instead include multiple discrete sub-circuits with any suitable degree of coupling therebetween to enable the operations disclosed and claimed herein.

The laser wavelength of the laser output 199 exhibits a dependence on the wavelength-control current $I_{WC}$; temporal variation of the wavelength-control current $I_{WC}$ results in temporal variation of the laser wavelength. In order to stabilize the laser wavelength (equivalently, to reduce phase noise on the laser output 199), phase error of temporal variation of the laser wavelength relative to temporal variation of the wavelength-control current $I_{WC}$ must remain sufficiently small; reduction of phase noise on the laser output 199 cannot be reliably achieved if that phase error is too large. Phase error less than about 0.5 radian over a desired range of wavelength-modulation frequencies typically is sufficiently small to reliably enable a useful degree of phase noise reduction of the laser output 199 over that range of wavelength-modulation frequencies. With the laser resonator (defined by the waveguide 102, the reflector 103, and the grating 104), the laser-control circuit 130, and the first and second electrodes 111/112 arranged and connected as shown in the various examples of the inventive laser source 100, the laser output 199 exhibits phase error, of temporal variation of the laser wavelength relative to temporal variation of the wavelength-control current $I_{WC}$, that is less than about 0.5 radian for all wavelength-modulation frequencies from about 0.0 Hz to about $1.0 \times 10^7$ Hz. In some examples that frequency range can extend to about $1.0 \times 10^8$ Hz, to about $1.0 \times 10^9$ Hz, or even higher. In some examples, the phase error over one or more of those frequency ranges can remain below or about equal to 0.3 radian, below or about equal to 0.1 radian, or even lower. The two-laser-segment, two-electrode arrangement of the inventive semiconductor laser source 100 (e.g., with one electrode positioned over a portion of the laser resonator with a grating and the other electrode positioned over a portion of the laser resonator without a grating), and flow of the wavelength-control current $I_{WC}$ through one or both of the electrodes (described further below), distinguishes the inventive laser source 100 from conventional wavelength-controlled or wavelength-stabilized semiconductor laser sources, and enables it to exhibit reduced phase error of temporal variation of the laser wavelength relative to temporal variation of the wavelength-control current $I_{WC}$.

Figure 5:
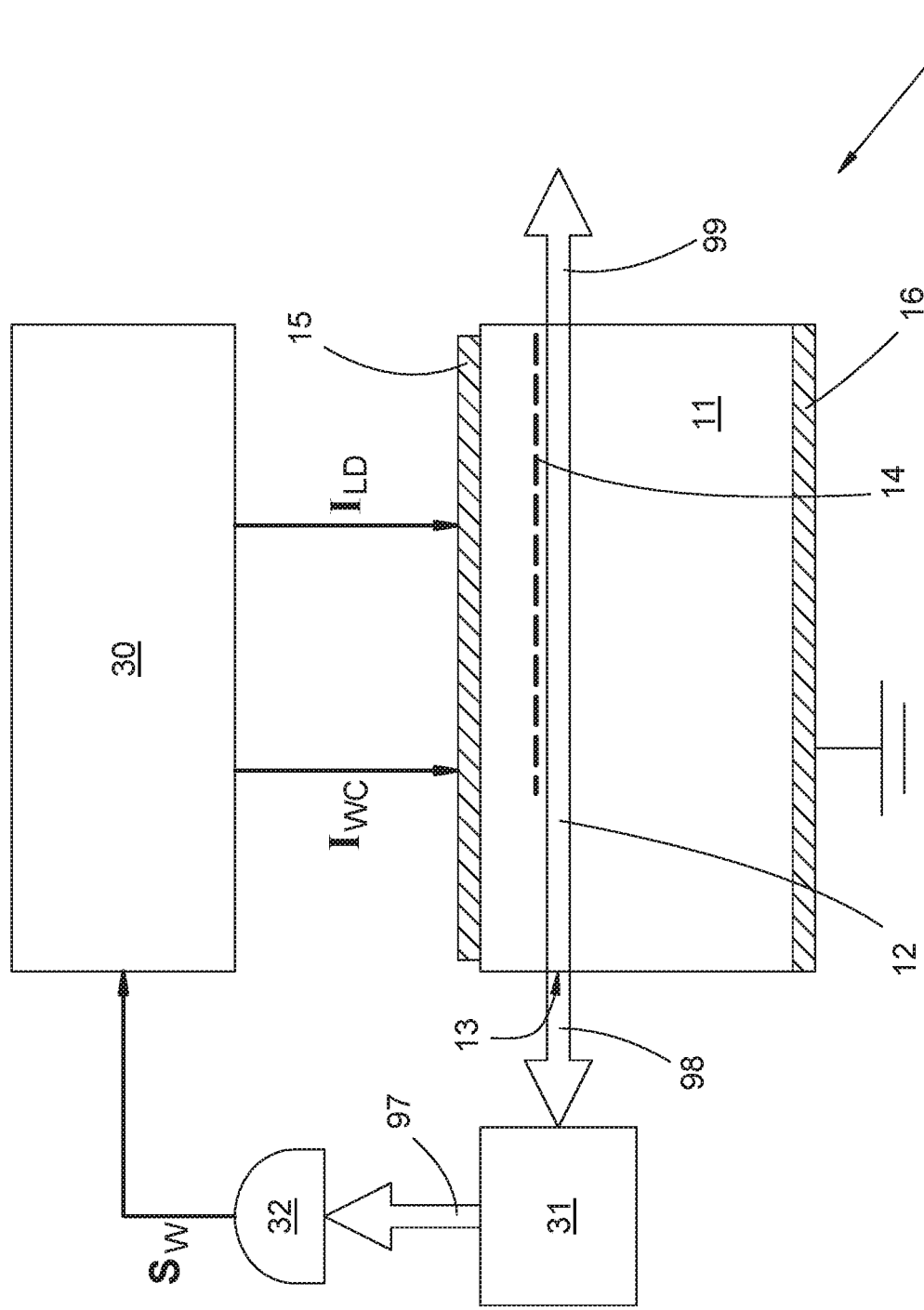
FIG. 5 illustrates schematically an example of a conventional laser source with wavelength stabilization.

An example of a conventional semiconductor laser source 10 is illustrated schematically in FIG. 5, and includes a distributed feedback laser resonator (waveguide 12, reflector 13, and grating 14 on substrate 11) and a single laser electrode 15 for injecting a laser drive current $I_{LD}$ into the laser to produce one or both laser outputs 98 or 99 (rearward- or forward-propagating, respectively). Some other examples of conventional semiconductor laser sources include multiple electrodes (not shown; examples disclosed in the Yoshikuni, Ishida, and Kourogi references cited above), but with all of the multiple electrodes positioned over corresponding portions of the laser grating. A laser-control circuit 30 receives a laser-wavelength electrical signal $S_W$ generated by a wavelength dependent fraction 97 of the laser output incident on an optical detector 32 (a portion of the rearward-propagating laser output 98 in the example shown; a portion of the forward-propagating laser output 99 in other examples). The laser-control circuit 30 generates a wavelength-control current $I_{WC}$ that flows through the electrode 15, thereby coupling the optical detector 32 and the laser electrode 15 in a feedback arrangement operative to control and stabilize the laser wavelength. The conventional arrangement of FIG. 5 enables, to varying degrees, stabilization of the laser wavelength (equivalently, reduction of phase noise on the laser output 99) for wavelength-modulation frequencies up to several hundred kHz. Unfortunately, in the conventional arrangement of FIG. 5, the phase error of temporal variation of the laser wavelength relative to temporal variation of the wavelength-control current $I_{WC}$ is observed to increase beyond a usable level at wavelength-modulation frequencies of several hundred kHz. Any feedback arrangement employing that signal would change from desirable negative feedback behavior at lower modulation frequencies to undesirable positive feedback behavior at higher modulation frequencies. Accordingly the laser-control circuit 30 typically includes an electrical low-pass filter to attenuate generation of the wavelength-control current $I_{WC}$ beginning around 10 kHz (to ensure sufficient attenuation at wavelength-modulation frequencies of several hundred kHz so as to mitigate or avoid the positive feedback behavior). The conventional arrangement exhibits phase noise reduction of about 40 dB up to about 10 kHz, diminishing phase noise reduction up to several hundred kHz, and no phase noise reduction (or even increased phase noise) for higher wavelength-modulation frequencies.

In contrast, with the laser resonator (defined by the waveguide 102, the reflector 103, and the grating 104), the laser-control circuit 130, and the first and second electrodes 111/112 arranged and connected as shown in the various examples of the inventive laser source 100, the laser output 199 exhibits phase error of temporal variation of the laser wavelength relative to temporal variation of the wavelength-control current $I_{WC}$ that remains within usable limits (e.g., less than about 0.5 radian, or less than that in some examples) for all wavelength-modulation frequencies from about 0.0 Hz to about $1.0 \times 10^7$ Hz (or higher than that in some examples), thereby greatly expanding the range of wavelength-modulation frequencies over which the laser wavelength can be controlled or stabilized with reduced phase noise. That behavior arises from the two-segment, two-electrode arrangement of the inventive laser source 100, which enables the wavelength-control current $I_{WC}$ to be applied to only one segment of the laser or the other (including the grating 104 or not; as in FIGS. 1A and 1C; discussed further below), or to both segments with opposite polarities (as in FIGS. 1B and 1D, discussed further below). The conventional laser source 10 has only a single electrode 15 through which the wavelength-control current $I_{WC}$ can be applied; other conventional laser sources with multiple electrodes do not enable the wavelength-control current $I_{WC}$ to be applied to a portion of the laser waveguide that does not include a portion of the grating.

In some examples of the inventive laser source 100, if needed or desired, the laser-control circuit 130 can include an electrical low-pass filter to attenuate generation of the wavelength-control current $I_{WC}$ at higher wavelength-modulation frequencies (e.g., above several hundred kHz, above about 1 MHz, above about 10 MHz, or above even higher wavelength-modulation frequencies). Such a low-pass filter can provide attenuation of the wavelength-control current $I_{WC}$ at higher wavelength-modulation frequencies that might exhibit overall phase error that is too large for achieving the desired reduction of phase noise on the laser output 199. That overall phase error includes the phase error between the wavelength-control current $I_{WC}$ and the laser wavelength (as described above) as well as additional phase error that can arise, at sufficiently high wavelength-modulation frequencies, from generation of the wavelength-control current $I_{WC}$ by the laser-control circuit 130.

Figure 8:
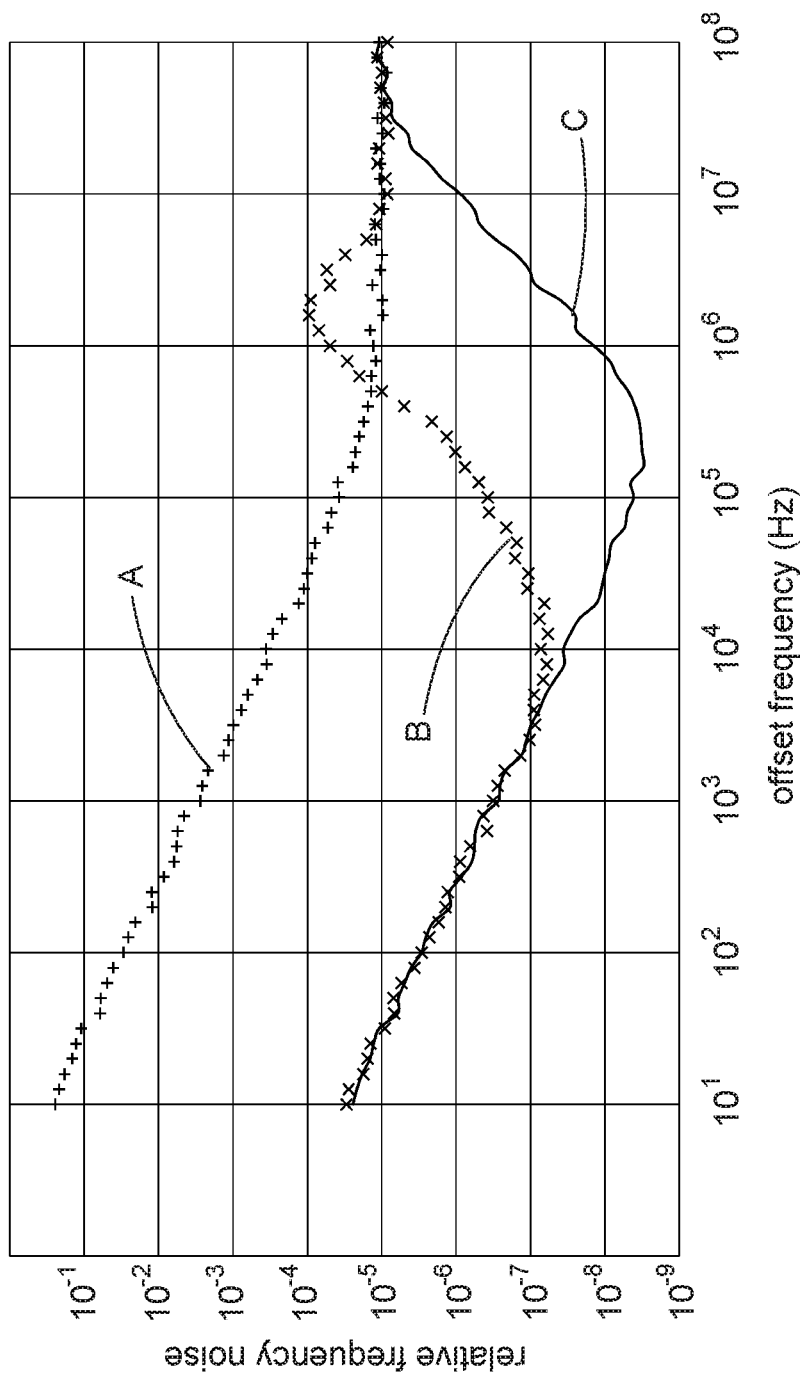
FIG. 8 is a plot of simulated noise spectra (on a relative scale) of an unstabilized laser source (curve A), a conventional wavelength-stabilized laser source (curve B), and an inventive wavelength-stabilized laser source (curve C).

FIG. 8 is a plot of simulated noise spectra (on a relative scale) of an unstabilized laser source (curve A), a conventional wavelength-stabilized laser source 10 (e.g., arranged as in FIG. 5; curve B), and an inventive wavelength-stabilized laser source 100 (e.g., arranged as in one of FIGS. 1A through 3B; curve C). The conventional and inventive arrangements exhibit similar phase noise reduction at wavelength-modulation frequencies up to about $1.0 \times 10^4$ Hz. Above that wavelength-modulation frequency, phase noise reduction degrades for the conventional laser source 10. For wavelength-modulation frequencies from several hundred kHz up to several MHz, performance of the conventional laser source 10 is actually worse than the unstabilized laser source. The inventive laser source 100 exhibits superior phase noise reduction (relative to the conventional wavelength-stabilized source 10) at wavelength modulation frequencies exceeding about $1.0 \times 10^4$ Hz.

In some examples, the laser source 100 can be operated with the feedback mechanism engaged to control or stabilize the laser wavelength, so that the laser output exhibits reduced phase noise (relative to operation of the laser source 100 without the feedback mechanism operating) at wavelength-modulation frequencies (also referred to as offset frequencies) exceeding about $1.0 \times 10^6$ Hz. In some of those examples, operation of the feedback arrangement results in reduced phase noise of the laser output at all offset frequencies between about $1.0 \times 10^6$ Hz and about $1.0 \times 10^7$ Hz, at offset frequencies exceeding about $1.0 \times 10^7$ Hz, or at offset frequencies exceeding about $1.0 \times 10^8$ Hz. In some examples, operation of the feedback arrangement results in phase noise of the laser output reduced by about 3 dB or more (i.e., reduced by about 50% or more), by about 5 dB or more (i.e., by about 70% or more), or by about 10 dB or more (i.e., by about 90% or more), at all offset frequencies between about $1.0 \times 10^6$ Hz and about $1.0 \times 10^7$ Hz. In some examples, operation of the feedback arrangement results in phase noise of the laser output reduced by about 10 dB or more (i.e., by about 90% or more), or about 20 dB or more (i.e., by about 99% or more), at an offset frequency of about $1.0 \times 10^6$ Hz.

In some examples, operation of the feedback arrangement results in phase noise of the laser output reduced by about 5 dB or more (i.e., by about 70% or more), or about 10 dB or more (i.e., by about 90% or more), at an offset frequency of about $1.0 \times 10^7$ Hz.

There are a number of ways the laser source 100 and laser-control circuit 130 can be operated to reduce phase noise in the laser output. Some of those arrangements might be better than others with respect to one or more of: (i) more effective reduction of phase noise at a given wavelength-modulation frequency or over a given range of wavelength-modulation frequencies, (ii) more effective reduction of phase noise over a wider range of wavelength-modulation frequencies, or (iii) decreasing unwanted modulation of laser output power arising from modulation of the laser wavelength. FIGS. 1A-1D illustrate four different ways that the wavelength-control current $I_{WC}$ can flow through one or both of the electrodes 111 or 112. In FIG. 1A, a total current $I_1 + I_{WC}$ flows into the first segment of the waveguide through the electrode 111 and a total current $I_2$ flows into the second segment of the waveguide through the electrode 112. In FIG. 1B, a total current $I_1 + I_{WC}$ flows into the first segment of the waveguide through the electrode 111 and a total current $I_2 - I_{WC}$ flows into the second segment of the waveguide through the electrode 112. In FIG. 1C, a total current $I_1$ flows into the first segment of the waveguide through the electrode 111 and a total current $I_2 + I_{WC}$ flows into the second segment of the waveguide through the electrode 112. In FIG. 1D, a total current $I_1 - I_{WC}$ flows into the first segment of the waveguide through the electrode 111 and a total current $I_2 + I_{WC}$ flows into the second segment of the waveguide through the electrode 112. In some or all of those four arrangements, the dependence of the laser wavelength as a function of the wavelength-control current $I_{WC}$ exhibits sufficiently small phase error for all the wavelength-modulation frequencies from about 0.0 Hz to about $1.0 \times 10^7$ Hz, (or to about $1.0 \times 10^8$ Hz, or to about 1.0 GHz or more in some examples). The examples of FIGS. 1A and 1C can be referred to as single-ended or unipolar, while the examples of FIGS. 1B and 1D can be referred to as differential or bipolar. It has been observed that bipolar arrangements often result in less unwanted modulation of laser output power than unipolar arrangements. However, unipolar arrangements also can provide acceptably low laser power modulation in some examples. Although the examples of FIGS. 2A, 2B, 3A, 3B, and 4 show only an arrangement similar to that of FIG. 1B for the wavelength-control current $I_{WC}$, and the examples of FIGS. 6A and 6B show only an arrangement similar to that of FIG. 1A, any of the arrangements of FIGS. 1A-1D for the wavelength-control current $I_{WC}$ can be employed in the examples of FIG. 2A, 2B, 3A, 3B, 4, 6A, or 6B.

The current densities $I_1/L_1$ and $I_2/L_2$ can differ between the rear segment of the laser (under the electrode 111) and the front segment of the laser (under the electrode 112). Typically, one of those current densities is less than the other, with (i) the lesser current density resulting in the optical gain of the corresponding waveguide segment being about zero or varying substantially linearly with respect to the current density, and (ii) the greater current density resulting in the optical gain of the corresponding waveguide segment being at least partly saturated with respect to the current density. It has been observed that operation of the laser source 100 with the wavelength-control current $+I_{WC}$ flowing into the waveguide segment with the lower current density (whether a unipolar or bipolar arrangement) appears to result in one or more of: (i) better phase noise reduction, (ii) over a wider range of wavelength-modulation frequencies, or (iii) less unwanted laser power modulation. However, arrangements with the wavelength-control current $+I_{WC}$ flowing into the waveguide segment with the higher current density also can provide acceptable performance with respect to one or more of those criteria in some examples.

The operational alternatives disclosed above (higher current density on the front versus the rear waveguide segment; $+I_{WC}$ flowing into the higher-versus lower-current-density waveguide segment; bipolar versus unipolar operation) result in eight operational combinations. One or a few of those typically will result in better performance than the others with respect to one or more of the criteria discussed above. However, which one or more of the eight operational combinations are better than the others can differ from device to device, even among nominally identical devices fabricated together on a common semiconductor wafer. In one proposed explanation, those operational differences are believed to arise from the influence of device-to-device variations of optical phase among optical signals propagating along the waveguide 102 and reflected by the reflector 103 or grating 104; those optical phase variations in turn arise from slight, unavoidable device-to-device variations in the optical phase delay (modal index variations or grating-to-reflector distance variations) for optical propagation between reflector 103 and the grating 104. One or more alternative explanations of the operational differences among devices could be applicable, instead of or in addition to that proposed above. Regardless of the origin of those operational differences, each laser source 100 can be tested and characterized, and the optimal operational combination among the eight (or a sufficiently good operational combination among the eight) can be selected for operating that particular device. Hardware switches, jumpers, transistors, or other similar circuit elements can be incorporated into the laser-control circuit 130 to facilitate that testing and selection process. In some instances, all eight operational combinations need not be tested or even made available to choose from, e.g., if it is observed that certain operational combinations consistently perform worse than the others or only rarely prove to be the optimum combination.

Any suitable one or more optical elements can be employed as the wavelength discriminator 131, which typically exhibits a wavelength-dependent reflection or transmission spectrum or other wavelength-dependent optical property. In a typical arrangement, the laser-control feedback mechanism operates to maintain the laser wavelength at a wavelength where the optical property (e.g., transmission or reflection) of the wavelength discriminator 131 is changing relatively rapidly as a function of wavelength. The steeper the wavelength dependence, the more tightly the feedback mechanism can control the wavelength and reduce phase noise. A wavelength-dependent fraction 197 of the laser output is directed (e.g., by wavelength-dependent transmission or reflection) by the wavelength discriminator 131 onto the optical detector 132, which in turn produces the laser-wavelength electrical signal $S_W$ that is delivered to the wavelength-control circuit 130 and compared to a reference level to generate an error signal. The wavelength-control circuit 130 can couple the optical detector 132 and one or both of the electrodes 111/112 in any suitable feedback arrangement to vary the wavelength-control current $I_{WC}$ so as to maintain the error signal near zero (i.e., to maintain the laser-wavelength signal $S_W$ near the selected reference level). Because the dependence of the laser wavelength on the laser-control current $I_{WC}$ exhibits sufficiently small phase error over a wide range of wavelength-modulation frequencies (e.g., from DC up to about 10 MHz, up to about 100 MHz, or even up to about 1 GHz or more), the feedback mechanism can be arranged so as to reduce phase noise on the laser output over that entire modulation frequency range, if sufficiently fast detector and electronics are employed.

In some examples, the wavelength discriminator 131 can include one or more of an optical low-pass filter, an optical high-pass filter, and optical bandpass filter, an optical notch-filter, a Fabry-Perot resonator, an optical interferometer, an optical grating, a fiber grating, an atomic or molecular absorption or emission line, or a spectroscopic feature. A transmission spectrum of a high-finesse Fabry-Perot resonator is well-suited for use as a wavelength discriminator 131 in some examples. The wavelength discriminator 131 can be implemented as a free-space optical element, or as a suitably adapted segment of an optical fiber or optical waveguide. An optical waveguide implementation can be advantageous in that it can be integrated onto the substrate 101 if desired. If a beamsplitter 196 is employed, it too can be implemented in any suitable way, e.g., as a free-space optical element, as a fiber-optic splitter, or as an optical waveguide splitter. The optical detector 132 can be of any suitable type; a photodiode is often employed, and can in some instances be integrated with or assembled onto the substrate 101.

If it is only desired to stabilize the laser wavelength at a fixed value and to reduce the phase noise of the laser output at that fixed wavelength, a suitable wavelength discriminator 131 can be chosen (e.g., a non-tunable Fabry-Perot resonator with a transmission peak sufficiently near the desired wavelength) and a suitable constant electrical reference level set for the wavelength-control circuit 130. It is often the case, however, that tuning or sweeping of the laser wavelength is desired while nevertheless maintaining reduced phase noise at offset frequencies above a lower limit imposed by the wavelength sweep rate. One or both of the wavelength discriminator 131 or the wavelength-control circuit 130 can be adapted in any suitable way so as to enable tuning or sweeping of the laser wavelength.

In some examples (e.g., as in the examples of FIGS. 6A and 7A), the wavelength-dependent properties of the wavelength discriminator 131 are substantially fixed. A variable sweep-control signal $S_{SC}$ is applied to the wavelength-control circuit 130 to generate a variable reference level $REF(S_{SC})$, which is a function of the applied sweep-control signal $S_{SC}$. As shown in FIG. 7A, with the reference level at a value of REF(1), the wavelength-dependent transmission curve C (which characterizes the wavelength discriminator 131 and optical detector 132) results in a wavelength-control current $I_{WC}$ flowing through the laser electrodes 111 or 112 that produces laser output at laser wavelength $\lambda(1)$; with the reference level at a value of REF(2), the wavelength-dependent curve C results in a wavelength-control current $I_{WC}$ flowing through the laser electrodes 111 or 112 that produces laser output at laser wavelength $\lambda(2)$. Sweeping the laser wavelength is accomplished by sweeping the reference level $REF(S_{SC})$ (indicated by the vertical double-headed arrow in FIG. 7A), which is in turn achieved by sweeping the sweep-control signal $S_{SC}$. In a simple example, REF $(S_{SC})=S_{SC}$. The tuning range is limited by the width of a monotonic portion of the curve C. A trade-off might be required between better phase noise reduction (needing a steeper and therefore narrower curve C) and a wider sweep range (needing a wider and therefore less steep curve C).

In some examples (e.g., as in the examples of FIGS. 6B and 7B), the wavelength-dependent properties of the wavelength discriminator 131 can be varied. A variable sweep-control signal $S_{SC}$ is applied to the wavelength discriminator 131 to vary one or more of its wavelength-dependent properties (e.g., to shift the reflection or transmission spectrum). As shown in FIG. 7B, with a fixed reference level REF, the wavelength-dependent transmission curve C(1) (which characterizes the wavelength discriminator 131 and optical detector 132 at a first level of the sweep-control signal $S_{SC}$) results in a wavelength-control current $I_{WC}$ flowing through the laser electrodes 111 or 112 that produces laser output at laser wavelength $\lambda(1)$; the wavelength-dependent transmission curve C(2) (which characterizes the wavelength discriminator 131 and optical detector 132 at a second level of the sweep-control signal $S_{SC}$) results in a wavelength-control current $I_{WC}$ flowing through the laser electrodes 111 or 112 that produces laser output at laser wavelength $\lambda(2)$. Sweeping the laser wavelength is accomplished by sweeping the sweep-control signal $S_{SC}$, which in turn shifts the wavelength-dependent curve C(x) (indicated by the horizontal double-headed arrow in FIG. 7B). The tuning range is not limited in these examples by the width of a monotonic portion of the curve C(x), but instead by how far that curve can be shifted by varying the sweep-control signal $S_{SC}$. Even for a relatively large tuning range, a relatively steeper and therefore narrower curve C(x) can be employed for achieving greater reduction of phase noise in the laser output.

Although the examples of FIGS. 6A and 6B show only an arrangement similar to that of FIG. 1A for the wavelength-control current $I_{WC}$, any of the arrangements of FIGS. 1A-1D for the wavelength-control current $I_{WC}$ can be employed in the examples of FIG. 6A or 6B. Although the sweep-control signal $S_{SC}$ is shown in FIGS. 6A and 6B is shown applied externally to the wavelength-control circuit 130 or the wavelength discriminator 131, in some examples that signal can be generated internally, e.g., by one or more portions of the wavelength-control circuit 130.

In examples similar to that of FIGS. 6B and 7B, any suitable tunable wavelength discriminator 131 can be employed and controlled (swept) by application of the sweep-control signal $S_{SC}$. Suitable tunable wavelength discriminators can include one or more of tunable Fabry-Perot resonators (tuned mechanically, electro-optically, or otherwise; implemented as a free-space element, in an optical fiber, or in an optical waveguide), optical fiber Fabry-Perot tunable filters, tunable fiber Bragg grating filters, tunable filters based on coupling to tunable resonant ring optical cavities, acousto-optic tunable filters, liquid crystal tunable filters, or other suitable tunable optical filters. A tunable Fabry-Perot resonator integrated as a waveguide onto a semiconductor substrate can be advantageously employed as the wavelength discriminator 131, particularly if integrated onto or assembled with the substrate 101, or coupled to the laser source 100 by an optical fiber. Tuning of a waveguide-based Fabry-Perot resonator can be achieved in a variety of ways, e.g., by applying the sweep-control signal $S_{SC}$ as a voltage across electro-optical material (e.g., lithium niobate, lithium tantalate, one or more III-V semiconductors or combinations thereof such as InGaAsP, or other suitable electro-optic material) in or near the waveguide resonator to alter its modal index (via the electro-optic effect) to shift its resonance frequencies (i.e., to shift the transmission curve C), or by applying the sweep-control signal $S_{SC}$ as a current across the waveguide resonator to alter its modal index (via altered carrier density) to shift its resonance frequencies (i.e., to shift the transmission curve C). Examples are disclosed in, e.g., the Barrios, Chang, and Suzuki references cited above; other suitable implementations can be employed.

One example of an application for which a swept-wavelength laser source with reduced phase noise can be advantageously employed is swept-optical-frequency LIDAR. For that or other applications, one or both of the wavelength discriminator 131 or the laser-control circuit 130 can be arranged as to sweep the laser wavelength over a wavelength range equivalent to an optical frequency range greater than about 1.0 GHz, greater than about 5 GHz, or greater than about 10. GHz. For swept-optical-frequency LIDAR or other applications, one or both of the wavelength discriminator or the laser-control circuit are arranged so as to sweep the laser wavelength at a wavelength sweep rate equivalent to a laser optical frequency sweep rate greater than about than about 0.10 GHz/µs, greater than about 1.0 GHz/µs, or greater than about 10. GHz/µs. In some applications, including swept-optical-frequency LIDAR, it is important that the optical frequency of the laser output vary substantially linearly with time, or if not linear, then its actual time dependence be known to enable compensation for the non-linearity. In some examples of an inventive laser source 100, including the example of FIGS. 6B and 7B, that linearity can be achieved by implementing a wavelength shift of the curve C(x) that is substantially linear with time. In some examples, the sweep of the laser optical frequency with respect to time deviates from linearity by less than about 1%, less than about 0.1%, or less than about 0.01%. The deviation from linearity is defined as the maximum deviation of the actual optical frequency from an ideal, linearly swept optical frequency, divided by the sweep range, e.g., a 100 MHz deviation within a 10 GHz sweep would be a 1% deviation, and so on.

In the examples of FIGS. 3A, 3B, and 4, the laser source 100 further includes an optical modulator 200 for reducing laser amplitude noise in the output of the laser source 100. Conventional laser amplitude stabilization arrangements monitor laser power and use feedback control of the laser drive current to stabilize the output power. That approach is undesirable in the inventive laser sources 100, because altering the laser currents $I_1$ or $I_2$ to control output power would result in concomitant alteration of the laser wavelength, thwarting the purpose of the wavelength control and stabilization mechanisms disclosed and claimed herein.

Instead, laser amplitude stabilization is achieved in the inventive laser source 100 using an external optical modulator 200. The modulator 200 is arranged to receive at least a portion of the laser output (the forward-propagating laser output 199 in FIGS. 3A, 3B, and 4; the rearward-propagating laser output 198 in other examples) and to modulate transmitted power of the laser output. The portion of the laser output transmitted by the modulator 200 is the amplitude-stabilized laser output 299. A second optical detector 232 is arranged so as to receive fraction 297 of the transmitted power so as to generate therefrom a laser-power electrical signal $S_P$. The fraction 297 preferably is substantially independent of the laser wavelength, so as to avoid undesirable coupling of wavelength and amplitude variations of the laser output. If a beamsplitter 296 is employed, it can be implemented in any suitable way, e.g., as a free-space optical element, as a fiber-optic splitter, or as an optical waveguide splitter. The optical detector 232 can be of any suitable type; a photodiode is often employed, and can in some instances be integrated with or assembled onto the substrate 101. A power-control electrical circuit (typically a portion of the laser control circuit 130) couples the second optical detector 232 and the optical modulator 200 so as to (i) generate from the laser-power electrical signal $S_P$ a power-control electrical signal $S_{PC}$, (ii) apply the laser-power electrical signal $S_{PC}$ to the optical modulator 200 and thereby alter the transmitted power, and (iii) operate as a laser-amplitude-noise-reduction feedback mechanism. The laser-amplitude-noise-reduction feedback mechanism can operate to reduce laser amplitude noise at offset frequencies below about $1.0 \times 10^6$ Hz, exceeding about $1.0 \times 10^6$ Hz, or exceeding about $1.0 \times 10^7$ Hz.

The modulator 200 can be of any suitable type (e.g., electro-optic, electro-absorption, Mach-Zehnder, optical amplifier, variable optical attenuator, acousto-optic, liquid crystal, and so forth) formed in any suitable medium (e.g., bulk semiconductor or dielectric, semiconductor or dielectric waveguide, optical fiber, and so forth). The details of the operation of various conventional types of external modulator 200 need not be repeated here. The laser output can be coupled to the modulator 200 in any suitable way, e.g., by free-space optical propagation that may include one or more optical elements, by propagation through an intervening optical fiber or waveguide, by butt-coupling of the waveguide 102 and the modulator 200, by integration of the laser resonator and modulator as distinct portions of a common waveguide on a common substrate (e.g., as in the example of FIG. 4), or by other suitable arrangements.

In some examples, the optical modulator 200 comprises a modulator optical waveguide formed on a modulator semiconductor substrate and a modulator electrode positioned over at least a portion of the modulator waveguide. The power-control electrical circuit applies the power-control electrical signal $S_{PC}$ to the optical modulator by deriving from the laser-power electrical signal $S_P$ a power-control current, and directing the power-modulation current as the power-control signal $S_{PC}$ through the modulator electrode into or out of the modulator waveguide so as to alter optical gain or loss of the laser output propagating along the modulator waveguide. That type of modulator operation is disclosed in several of the references incorporated above. In some of those examples, the laser and modulator substrates form a single, common substrate 101, and the laser and modulator waveguides form a single, common waveguide 102 with the modulator electrode 213 formed over the modulator segment of the waveguide 102 (e.g., as in the example of FIG. 4). In other examples, other types of modulator 200 that can be implemented as one or more waveguides (e.g., electro-absorption or Mach-Zehnder) can be integrated with the laser source 100 on the common substrate 101 (e.g., as in the example of FIG. 4).

The arrangement illustrated by the examples of FIGS. 6B and 7B (in which the wavelength of the laser output is swept by sweeping a wavelength-dependent property of a wavelength discriminator to which a laser source is locked by a laser-control circuit) can be inventively employed in a second group of inventive embodiments using a laser source of another suitable type, not only the two-laser-segment, two-electrode laser sources in the first group of inventive embodiments described above. Using any suitable tunable laser source (e.g., a Fabry-Perot laser, a DBR laser, a full- or partial-DFB laser, or other tunable semiconductor laser, using one or more laser electrodes; in other instances a tunable solid state laser, a tunable dye laser, a tunable gas laser, and so forth), a wavelength-dependent fraction of the laser output is directed by a wavelength discriminator onto a detector (as above), which generates a laser-wavelength electrical signal (as above). That laser-wavelength electrical signal is applied to a laser-control circuit to control the wavelength of the laser output in any suitable way (e.g., by controlling laser drive current or a wavelength control current as described above; by controlling laser temperature, charge carrier density, or other semiconductor laser operating parameter; by controlling optical pump power, position or alignment of an optical tuning element such as a birefringent plate or a grating or an etalon, or other tuning mechanism). Any of the tunable wavelength discriminators described above can be employed, and its wavelength-dependent properties controlled by application of a variable sweep-control signal as described above. If needed or desirable, a modulator of any suitable type (including those described above) can also be employed (as described above) to reduce laser amplitude noise of the swept-frequency laser output. One example of this second group of inventive embodiments includes a tunable semiconductor laser and an electrooptically tunable wavelength discriminator (e.g., an electrooptically tunable Fabry-Perot resonator, in some cases integrated along with the semiconductor onto a common substrate).

In addition to the preceding, the following examples fall within the scope of the present disclosure or appended claims:

Example 1

A semiconductor laser source comprising: (a) a semiconductor substrate; (b) an optical waveguide formed on the substrate and arranged so as to provide position-dependent optical gain or loss, for an optical signal that propagates along the waveguide within an operating wavelength range of the laser source, that varies according to a position-dependent level of electrical current density flowing into or out of the optical waveguide; (c) an optical reflector arranged on the substrate or waveguide so as to reflect, to propagate along the optical waveguide in a forward direction, at least a portion of an optical signal propagating along the waveguide in a rearward direction within the operating wavelength range; (d) an optical grating arranged on the substrate or waveguide so as to diffract, to propagate in the rearward direction along the waveguide toward the reflector, at least a portion of an optical signal propagating along the waveguide in the forward direction within the operating wavelength range, wherein the waveguide, reflector, and grating define a laser resonator arranged so that laser output from the laser resonator propagates (i) in the forward direction from the grating along the waveguide, (ii) in the rearward direction from the optical reflector, or (iii) in both directions, the laser output being characterized by a laser wavelength; (e) a first laser electrode positioned over a first segment, of length $L_1$, of the waveguide between the reflector and the grating, the first laser electrode being arranged so as to enable a substantially constant first laser current $I_1$ to flow through the first laser electrode into the first segment of the waveguide and produce optical gain therein; (f) a second laser electrode positioned over a second segment, of length $L_2$, of the waveguide that includes at least a portion of the grating, the second laser electrode being arranged so as to enable a substantially constant second laser current $I_2$ to flow through the second laser electrode into the second segment of the waveguide and produce optical gain therein; (g) an optical detector and a wavelength discriminator, with the wavelength discriminator being arranged so as to direct a wavelength-dependent fraction of the laser output onto the optical detector so as to generate therefrom a laser-wavelength electrical signal; and (h) a laser-control electrical circuit coupling the optical detector and one or both of the first or second laser electrodes in a feedback arrangement operative to control and stabilize the laser wavelength relative to a wavelength-dependent property of the wavelength discriminator, wherein the laser-control electrical circuit is arranged so as to (i) derive from the laser-wavelength electrical signal a wavelength-control current $I_{WC}$, (ii) direct the first laser current $I_1$ to flow through the first laser electrode, (iii) direct the second laser current $I_2$ to flow through the second laser electrode, and (iv) direct the wavelength-control current $I_{WC}$ to flow through one or both of the first or second laser electrodes.

Example 2

The laser source of Example 1 wherein the laser resonator, the laser-control electrical circuit, and the first and second laser electrodes are arranged and connected so that the laser output exhibits phase error of temporal variation of the laser wavelength relative to temporal variation of the wavelength-control current $I_{WC}$ that is less than about 0.5 radian for all wavelength-modulation frequencies from about 0.0 Hz to about $1.0 \times 10^7$ Hz.

Example 3

The laser source of any one of Examples 1 or 2 wherein the laser resonator, the laser-control electrical circuit, and the first and second laser electrodes are arranged and connected so that the laser output exhibits phase error of temporal variation of the laser wavelength relative to temporal variation of the wavelength-control current $I_{WC}$ that is less than about 0.5 radian for all wavelength-modulation frequencies from about 0.0 Hz to about $1.0 \times 10^8$ Hz.

Example 4

The laser source of any one of Examples 1 through 3 wherein the laser resonator, the laser-control electrical circuit, and the first and second laser electrodes are arranged and connected so that the laser output exhibits phase error of temporal variation of the laser wavelength relative to temporal variation of the wavelength-control current $I_{WC}$ that is less than about 0.5 radian for all wavelength-modulation frequencies from about 0.0 Hz to about 1.0 GHz.

Example 5

The laser source of any one of Examples 1 through 4 wherein the laser resonator, the laser-control electrical circuit, and the first and second laser electrodes are arranged and connected so that the laser output exhibits phase error of temporal variation of the laser wavelength relative to temporal variation of the wavelength-control current $I_{WC}$ that is less than about 0.3 radian for all wavelength-modulation frequencies from about 0.0 Hz to about $1.0 \times 10^7$ Hz.

Example 6

The laser source of any one of Examples 1 through 5 wherein the laser resonator, the laser-control electrical circuit, and the first and second laser electrodes are arranged and connected so that the laser output exhibits phase error of temporal variation of the laser wavelength relative to temporal variation of the wavelength-control current $I_{WC}$ that is less than about 0.1 radian for all wavelength-modulation frequencies from about 0.0 Hz to about $10.0 \times 10^7$ Hz.

Example 7

The laser source of any one of Examples 1 through 6 wherein the laser-control electrical circuit is arranged so as to direct the wavelength-control current $I_{WC}$ to flow through the first laser electrode so that (i) a total current $I_1+I_{WC}$ flows into the first segment of the waveguide and (ii) a total current $I_2$ flows into the second segment of the waveguide.

Example 8

The laser source of any one of Examples 1 through 6 wherein the laser-control electrical circuit is arranged so as to direct the wavelength-control current $I_{WC}$ to flow through the first and second laser electrodes so that (i) a total current $I_1+I_{WC}$ flows into the first segment of the waveguide and (ii) a total current $I_2-I_{WC}$ flows into the second segment of the waveguide.

Example 9

The laser source of any one of Examples 1 through 6 wherein the laser-control electrical circuit is arranged so as to direct the wavelength-control current $I_{WC}$ to flow through the second laser electrode so that (i) a total current $I_1$ flows into the first segment of the waveguide and (ii) a total current $I_2+I_{WC}$ flows into the second segment of the waveguide.

Example 10

The laser source of any one of Examples 1 through 6 wherein the laser-control electrical circuit is arranged so as to direct the wavelength-control current $I_{WC}$ to flow through the first and second laser electrodes so that (i) a total current $I_1-I_{WC}$ flows into the first segment of the waveguide and (ii) a total current $I_2+I_{WC}$ flows into the second segment of the waveguide.

Example 11

The laser source of any one of Examples 1 through 10 wherein (i) a current density $I_1/L_1$ is less than a current density $I_2/L_2$, (ii) the current density $I_1/L_1$ results in the optical gain of the first segment of the waveguide being about zero or varying substantially linearly with respect to the current density $I_1/L_1$, and (iii) the current density $I_2/L_2$ results in the optical gain of the second segment of the waveguide being at least partly saturated with respect to the current density $I_2/L_2$.

Example 12

The laser source of any one of Examples 1 through 10 wherein (i) a current density $I_1/L_1$ is greater than a current density $I_2/L_2$, (ii) the current density $I_1/L_1$ results in the optical gain of the first segment of the waveguide being at least partly saturated with respect to the current density $I_1/L_1$, and (iii) the current density $I_2/L_2$ results in the optical gain of the second segment of the waveguide being about zero or varying substantially linearly with respect to the current density $I_2/L_2$.

Example 13

The laser source of any one of Examples 1 through 12 wherein the laser resonator, the laser-control electrical circuit, and the first and second laser electrodes are arranged and connected so that operation of the feedback arrangement results in reduced phase noise of the laser output, relative to operation of the laser source without operation of the feedback arrangement, at offset frequencies below about $1.0\times10^6$ Hz.

Example 14

The laser source of any one of Examples 1 through 13 wherein the laser resonator, the laser-control electrical circuit, and the first and second laser electrodes are arranged and connected so that operation of the feedback arrangement results in reduced phase noise of the laser output, relative to operation of the laser source without operation of the feedback arrangement, at offset frequencies exceeding about $1.0\times10^6$ Hz.

Example 15

The laser source of any one of Examples 1 through 14 wherein the laser resonator, the laser-control electrical circuit, and the first and second laser electrodes are arranged and connected so that operation of the feedback arrangement results in reduced phase noise of the laser output, relative to operation of the laser source without operation of the feedback arrangement, at all offset frequencies between about $1.0\times10^6$ Hz and about $1.0\times10^7$ Hz.

Example 16

The laser source of any one of Examples 1 through 15 wherein the laser resonator, the laser-control electrical circuit, and the first and second laser electrodes are arranged and connected so that operation of the feedback arrangement results in reduced phase noise of the laser output, relative to operation of the laser source without operation of the feedback arrangement, at offset frequencies exceeding about $1.0\times10^7$ Hz.

Example 17

The laser source of any one of Examples 1 through 16 wherein the laser resonator, the laser-control electrical circuit, and the first and second laser electrodes are arranged and connected so that operation of the feedback arrangement results in reduced phase noise of the laser output, relative to operation of the laser source without operation of the feedback arrangement, at offset frequencies exceeding about $1.0\times10^8$ Hz.

Example 18

The laser source of any one of Examples 1 through 17 wherein the laser resonator, the laser-control electrical circuit, and the first and second laser electrodes are arranged and connected so that operation of the feedback arrangement results in phase noise of the laser output reduced, relative to operation of the laser source without operation of the feedback arrangement, by about 3 dB or more at all offset frequencies between about $1.0\times10^6$ Hz and about $1.0\times10^7$ Hz, by about 5 dB or more at all offset frequencies between about $1.0\times10^6$ Hz and about $1.0\times10^7$ Hz, or by about 10 dB or more at all offset frequencies between about $1.0\times10^6$ Hz and about $1.0\times10^7$ Hz.

Example 19

The laser source of any one of Examples 1 through 18 wherein the laser resonator, the laser-control electrical circuit, and the first and second laser electrodes are arranged and connected so that operation of the feedback arrangement results in phase noise of the laser output reduced, relative to operation of the laser source without operation of the feedback arrangement, by about 10 dB or more at an offset frequency of about $1.0 \times 10^6$ Hz, or by about 20 dB or more at an offset frequency of about $1.0 \times 10^6$ Hz.

Example 20

The laser source of any one of Examples 1 through 19 wherein the laser resonator, the laser-control electrical circuit, and the first and second laser electrodes are arranged and connected so that operation of the feedback arrangement results in phase noise of the laser output reduced, relative to operation of the laser source without operation of the feedback arrangement, by about 5 dB or more at an offset frequency of about $1.0 \times 10^7$ Hz, or by about 10 dB or more at an offset frequency of about $1.0 \times 10^7$ Hz.

Example 21

The laser source of any one of Examples 1 through 20 wherein the laser-control circuit includes an electrical low-pass filter, and the electrical low-pass filter is arranged so as to attenuate generation of the wavelength-control current $I_{WC}$ at wavelength-modulation frequencies above about $1.0 \times 10^8$ Hz.

Example 22

The laser source of Example 21 wherein the electrical low-pass filter is arranged so as to attenuate generation of the wavelength-control current $I_{WC}$ at wavelength-modulation frequencies above about $1.0 \times 10^8$ Hz.

Example 23

The laser source of any one of Examples 21 or 22 wherein the electrical low-pass filter is arranged so as to attenuate generation of the wavelength-control current $I_{WC}$ at wavelength-modulation frequencies above about $1.0 \times 10^7$ Hz.

Example 24

The laser source of any one of Examples 21 through 23 wherein the electrical low-pass filter is arranged so as to attenuate generation of the wavelength-control current $I_{WC}$ at wavelength-modulation frequencies above about $1.0 \times 10^6$ Hz.

Example 25

The laser source of any one of Examples 21 through 24 wherein the electrical low-pass filter is arranged so as to attenuate generation of the wavelength-control current $I_{WC}$ at wavelength-modulation frequencies above about $1.0 \times 10^6$ Hz.

Example 26

The laser source of any one of Examples 1 through 25 wherein the optical reflector is positioned at an edge facet of the substrate.

Example 27

The laser source of any one of Examples 1 through 26 wherein the optical grating comprises a Bragg grating formed in or on the substrate or waveguide.

Example 28

The laser source of any one of Examples 1 through 27 wherein one or both of the wavelength discriminator or the optical detector are integrated onto the semiconductor substrate.

Example 29

The laser source of any one of Examples 1 through 28 wherein the wavelength discriminator exhibits a wavelength-dependent reflection or transmission spectrum, and includes one or more of an optical low-pass filter, an optical high-pass filter, and optical bandpass filter, an optical notch-filter, a Fabry-Perot resonator, an optical interferometer, an optical grating, a fiber grating, an atomic or molecular absorption or emission line, or a spectroscopic feature.

Example 30

The laser source of any one of Examples 1 through 29 wherein one or both of the wavelength discriminator or the laser-control circuit are arranged so as to sweep the laser wavelength.

Example 31

The laser source of Example 30 wherein one or both of the wavelength discriminator or the laser-control circuit are arranged so as to sweep the laser wavelength over a wavelength range equivalent to an optical frequency range greater than about 1.0 GHz, greater than about 5 GHz, or greater than about 10. GHz.

Example 32

The laser source of any one of Examples 30 or 31 wherein one or both of the wavelength discriminator or the laser-control circuit are arranged so as to sweep the laser wavelength at a wavelength sweep rate equivalent to a laser optical frequency sweep rate greater than about than about 0.10 GHz/µs, greater than about 1.0 GHz/µs, or greater than about 10. GHz/µs.

Example 33

The laser source of any one of Examples 30 through 32 wherein the sweep of the laser wavelength results in sweep of the laser optical frequency that is substantially linear with respect to time.

Example 34

The laser source of Example 33 wherein the sweep of the laser optical frequency with respect to time deviates from linearity by less than about 1%, less than about 0.1%, or less than about 0.01%.

Example 35

The laser source of any one of Examples 1 through 34 wherein wavelength-dependent properties of the wavelength discriminator are substantially fixed.

Example 36

The laser source of Example 35 wherein the wavelength discriminator exhibits a substantially fixed wavelength-dependent reflection or transmission spectrum, and includes one or more of an optical low-pass filter, an optical high-pass filter, and optical bandpass filter, an optical notch-filter, a Fabry-Perot resonator, an optical interferometer, an optical grating, a fiber grating, an atomic or molecular absorption or emission line, or a spectroscopic feature.

Example 37

The laser source of any one of Examples 1 through 34 wherein the wavelength discriminator is arranged so as to exhibit one or more variable wavelength-dependent properties, and the wavelength discriminator and the laser-control circuit are arranged so as to sweep the laser wavelength according to sweeping of one or more of the one or more variable wavelength-dependent properties of the wavelength discriminator.

Example 38

The laser source of Example 37 wherein the wavelength discriminator exhibits a variable wavelength-dependent reflection or transmission spectrum, and includes one or more of an optical low-pass filter, an optical high-pass filter, an optical bandpass filter, an optical notch-filter, a Fabry-Perot resonator, an optical interferometer, an optical grating, a fiber grating, an atomic or molecular absorption or emission line, or a spectroscopic feature.

Example 39

The laser source of Example 37 wherein the wavelength discriminator includes a tunable Fabry-Perot resonator, and the laser-control circuit is arranged so as to sweep the laser wavelength according to sweeping a reflection or transmission spectrum of the tunable Fabry-Perot resonator.

Example 40

The laser source of Example 39 wherein the tunable Fabry-Perot resonator is integrated onto the semiconductor substrate.

Example 41

The laser source of Example 39 wherein the tunable Fabry-Perot resonator is assembled with the semiconductor substrate.

Example 42

The laser source of Example 39 wherein the tunable Fabry-Perot resonator is optically coupled to the laser source by optical fiber.

Example 43

The laser source of Example 39 wherein the tunable Fabry-Perot resonator includes a Fabry-Perot waveguide segment incorporating one or more electro-optic materials in, on, or near the Fabry-Perot waveguide segment and arranged so as to alter resonant optical frequencies of the Fabry-Perot resonator in response to a wavelength-sweep control signal applied to the Fabry-Perot waveguide segment that alters a refractive index of the electro-optic material.

Example 44

The laser source of Example 43 wherein the one or more electro-optic materials include one or more of lithium niobate, lithium tantalate, or one or more III-V semiconductors or combinations thereof (e.g., InGaAsP).

Example 45

The laser source of Example 39 wherein the tunable Fabry-Perot resonator includes a Fabry-Perot waveguide segment incorporating one or more semiconductor materials in, on, or near the Fabry-Perot waveguide segment and arranged so as to alter resonant optical frequencies of the Fabry-Perot resonator in response to a wavelength-sweep control signal applied to the Fabry-Perot waveguide segment that alters an electric current density flowing through the Fabry-Perot waveguide segment.

Example 46

The laser source of any one of Examples 1 through 45 further comprising: (i) an optical modulator arranged to modulate transmitted power of the laser output; (j) a second optical detector arranged so as to receive a fraction of the transmitted power so as to generate therefrom a laser-power electrical signal; and (k) a power-control electrical circuit coupling the second optical detector and the optical modulator so as to (i) generate from the laser-power electrical signal a power-control electrical signal, (ii) apply the power-control electrical signal to the optical modulator and thereby alter the transmitted power, and (iii) operate as a laser-amplitude-noise-reduction feedback mechanism.

Example 47

The laser source of Example 46 wherein the laser-amplitude-noise-reduction feedback mechanism is arranged so as to reduce laser amplitude noise at offset frequencies below about $1.0 \times 10^6$ Hz, exceeding about $1.0 \times 10^6$ Hz, or exceeding about $1.0 \times 10^7$ Hz.

Example 48

The laser source of any one of Examples 46 or 47 wherein: (i) the optical modulator comprises a modulator optical waveguide formed on a modulator semiconductor substrate and a modulator electrode positioned over at least a portion of the modulator waveguide; (ii) the modulator waveguide is arranged so as to receive at least a portion of the laser output to propagate along the modulator waveguide; and (iii) the power-control electrical circuit applies the laser-power electrical signal to the optical modulator by deriving from the laser-power electrical signal a power-modulation current, and directing the power-modulation current through the modulator electrode into or out of the modulator waveguide so as to alter optical gain or loss of the laser output propagating along the modulator waveguide.

Example 49

The laser source of Example 48 wherein the laser and modulator substrates form a single, common substrate, and the laser and modulator waveguides form a single, common waveguide.

Example 50

The laser source of any one of Examples 46 or 47 wherein the optical modulator comprises an electro-absorption modulator or a Mach-Zehnder modulator.

Example 51

The laser source of any one of Examples 46 through 50 wherein the laser-control electrical circuit includes the power-control electrical circuit.

Example 52

The laser source of any one of Examples 1 through 51 wherein no portion of the optical grating lies below the first laser electrode.

Example 53

The laser source of any one of Examples 1 through 52 wherein the optical grating lies entirely below the second laser electrode.

Example 54

A method for operating the laser source of any one of Examples 1 through 53, the method comprising: (A) applying the first laser current $I_1$ to the first segment of the waveguide through the first laser electrode and applying the second laser current $I_2$ to the second segment of the waveguide through the second laser electrode, thereby producing the laser output to propagate along the waveguide; and (B) operating the laser-control electrical circuit so as to direct the wavelength-control current $I_{WC}$ to flow through one or both of the first or second laser electrodes and thereby control and stabilize the laser wavelength.

Example 55

A method for operating the laser source of any one of Examples 30 through 53, the method comprising: (A) applying the first laser current $I_1$ to the first segment of the waveguide through the first laser electrode and applying the second laser current $I_2$ to the second segment of the waveguide through the second laser electrode, thereby producing the laser output to propagate along the waveguide; and (B) operating the wavelength discriminator or the laser-control electrical circuit so as to direct the wavelength-control current $I_{WC}$ to flow through one or both of the first or second laser electrodes and thereby control, stabilize, and sweep the laser wavelength.

Example 56

A method for operating the laser source of any one of Examples 37 through 53, the method comprising: (A) applying the first laser current $I_1$ to the first segment of the waveguide through the first laser electrode and applying the second laser current $I_2$ to the second segment of the waveguide through the second laser electrode, thereby producing the laser output to propagate along the waveguide; and (B) sweeping one or more of the one or more variable wavelength-dependent properties of the wavelength discriminator and operating the laser-control electrical circuit so as to direct the wavelength-control current $I_{WC}$ to flow through one or both of the first or second laser electrodes and thereby control, stabilize, and sweep the laser wavelength.

Example 57

A method for operating the laser source of any one of Examples 46 through 53, the method comprising: (A) applying the first laser current $I_1$ to the first segment of the waveguide through the first laser electrode and applying the second laser current $I_2$ to the second segment of the waveguide through the second laser electrode, thereby producing the laser output to propagate along the waveguide; (B) operating the laser-control electrical circuit so as to direct the wavelength-control current $I_{WC}$ to flow through one or both of the first or second laser electrodes and thereby control and stabilize the laser wavelength; and (C) operating the power-control electrical circuit so as to reduce amplitude noise of the laser output.

Example 58

A semiconductor laser source comprising: (a) a semiconductor substrate; (b) an optical waveguide formed on the substrate and arranged so as to provide position-dependent optical gain or loss, for an optical signal that propagates along the waveguide within an operating wavelength range of the laser source, that varies according to a position-dependent level of electrical current density flowing into or out of the optical waveguide; (c) one or more optical reflectors or one or more optical gratings arranged on the substrate or waveguide so as to define along the waveguide a laser resonator arranged so that laser output from the laser resonator propagates along the waveguide away from the laser resonator in a forward direction, in a rearward direction, or in both directions, the laser output being characterized by a laser wavelength; (d) one or more laser electrodes positioned over one or more corresponding segments of the laser resonator, each laser electrode being arranged so as to enable a corresponding laser current or wavelength control current to flow therethrough and into or out of the corresponding segment of the laser resonator; (e) an optical detector and a wavelength discriminator, with the wavelength discriminator being arranged so as to direct a wavelength-dependent fraction of the laser output onto the optical detector so as to generate therefrom a laser-wavelength electrical signal; and (f) a laser-control electrical circuit coupling the optical detector and one or more of the one or more laser electrodes in a feedback arrangement operative to control and stabilize the laser wavelength relative to a wavelength-dependent property of the wavelength discriminator, wherein: (g) the laser-control electrical circuit is arranged so as to (i) derive from the laser-wavelength electrical signal a wavelength-control current $I_{WC}$, (ii) direct a corresponding substantially constant laser current to flow through each laser electrode, and (iii) direct the wavelength-control current $I_{WC}$ to flow through one or more of the one or more laser electrodes; (h) the wavelength discriminator and the laser-control circuit are arranged so as to sweep the laser wavelength; (i) the wavelength discriminator is arranged so as to exhibit one or more variable wavelength-dependent properties; and (j) the wavelength discriminator and the laser-control circuit are arranged so as to sweep the laser wavelength according to sweeping of one or more of the one or more variable wavelength-dependent properties of the wavelength discriminator.

Example 59

The laser source of Example 58 wherein one or both of the wavelength discriminator or the optical detector are integrated onto the semiconductor substrate.

Example 60

The laser source of any one of Examples 58 and 59 wherein the wavelength discriminator exhibits a variable wavelength-dependent reflection or transmission spectrum, and includes one or more of an optical low-pass filter, an optical high-pass filter, an optical bandpass filter, an optical notch-filter, a Fabry-Perot resonator, an optical interferometer, an optical grating, a fiber grating, an atomic or molecular absorption or emission line, or a spectroscopic feature.

Example 61

The laser source of any one of Examples 58 through 60 wherein the wavelength discriminator includes a tunable Fabry-Perot resonator, and the laser-control circuit is arranged so as to sweep the laser wavelength according to sweeping a reflection or transmission spectrum of the tunable Fabry-Perot resonator.

Example 62

The laser source of Example 61 wherein the tunable Fabry-Perot resonator is integrated onto the semiconductor substrate.

Example 63

The laser source of Example 61 wherein the tunable Fabry-Perot resonator is assembled with the semiconductor substrate.

Example 64

The laser source of Example 61 wherein the tunable Fabry-Perot resonator is optically coupled to the laser source by optical fiber.

Example 65

The laser source of Example 61 wherein the tunable Fabry-Perot resonator includes a Fabry-Perot waveguide segment incorporating one or more electro-optic materials in, on, or near the Fabry-Perot waveguide segment and arranged so as to alter resonant optical frequencies of the Fabry-Perot resonator in response to a wavelength-sweep control signal applied to the Fabry-Perot waveguide segment that alters a refractive index of the electro-optic material.

Example 66

The laser source of Example 65 wherein the one or more electro-optic materials include one or more of lithium niobate, lithium tantalate, or one or more III-V semiconductors or combinations thereof (e.g., InGaAsP).

Example 67

The laser source of Example 61 wherein the tunable Fabry-Perot resonator includes a Fabry-Perot waveguide segment incorporating one or more semiconductor materials in, on, or near the Fabry-Perot waveguide segment and arranged so as to alter resonant optical frequencies of the Fabry-Perot resonator in response to a wavelength-sweep control signal applied to the Fabry-Perot waveguide segment that alters an electric current density flowing through the Fabry-Perot waveguide segment.

Example 68

The laser source of any one of Examples 58 through 67 wherein one or both of the wavelength discriminator or the laser-control circuit are arranged so as to sweep the laser wavelength over a wavelength range equivalent to an optical frequency range greater than about 1.0 GHz, greater than about 5 GHz, or greater than about 10. GHz.

Example 69

The laser source of any one of Examples 58 through 68 wherein one or both of the wavelength discriminator or the laser-control circuit are arranged so as to sweep the laser wavelength at a wavelength sweep rate equivalent to a laser optical frequency sweep rate greater than about than about 0.10 GHz/µs, greater than about 1.0 GHz/µs, or greater than about 10. GHz/µs.

Example 70

The laser source of any one of Examples 58 through 69 wherein the sweep of the laser wavelength results in sweep of the laser optical frequency that is substantially linear with respect to time.

Example 71

The laser source of Example 70 wherein the sweep of the laser optical frequency with respect to time deviates from linearity by less than about 1%, less than about 0.1%, or less than about 0.01%.

Example 72

The laser source of any one of Examples 58 through 71 further comprising: (k) an optical modulator arranged to modulate transmitted power of the laser output; (l) a second optical detector arranged so as to receive a fraction of the transmitted power so as to generate therefrom a laser-power electrical signal; and (m) a power-control electrical circuit coupling the second optical detector and the optical modulator so as to (i) generate from the laser-power electrical signal a power-control electrical signal, (ii) apply the power-control electrical signal to the optical modulator and thereby alter the transmitted power, and (iii) operate as a laser-amplitude-noise-reduction feedback mechanism.

Example 73

The laser source of Example 72 wherein the laser-amplitude-noise-reduction feedback mechanism is arranged so as to reduce laser amplitude noise at offset frequencies below about $1.0 \times 10^6$ Hz, exceeding about $1.0 \times 10^6$ Hz, or exceeding about $1.0 \times 10^7$ Hz.

Example 74

The laser source of any one of Examples 72 or 73 wherein: (i) the optical modulator comprises a modulator optical waveguide formed on a modulator semiconductor substrate and a modulator electrode positioned over at least a portion of the modulator waveguide; (ii) the modulator waveguide is arranged so as to receive at least a portion of the laser output to propagate along the modulator waveguide; and (iii) the power-control electrical circuit applies the laser-power electrical signal to the optical modulator by deriving from the laser-power electrical signal a power-modulation current, and directing the power-modulation current through the modulator electrode into or out of the modulator waveguide so as to alter optical gain or loss of the laser output propagating along the modulator waveguide.

Example 75

The laser source of Example 74 wherein the laser and modulator substrates form a single, common substrate, and the laser and modulator waveguides form a single, common waveguide.

Example 76

The laser source of any one of Examples 72 or 73 wherein the optical modulator comprises an electro-absorption modulator or a Mach-Zehnder modulator.

Example 77

The laser source of any one of Examples 72 through 76 wherein the laser-control electrical circuit includes the power-control electrical circuit.

Example 78

A method for operating the laser source of any one of Examples 58 through 77, the method comprising: (A) applying the one or more laser currents to the corresponding one or more segments of the laser resonator through the one or more corresponding laser electrodes, thereby producing the laser output to propagate along the waveguide; and (B) sweeping one or more of the one or more variable wavelength-dependent properties of the wavelength discriminator and operating the laser-control electrical circuit so as to direct the wavelength-control current $I_{WC}$ to flow through one or both of the first or second laser electrodes and thereby control, stabilize, and sweep the laser wavelength.

Example 79

A method for operating the laser source of any one of Examples 72 through 77, the method comprising: (A) applying the first laser current $I_1$ to the first segment of the waveguide through the first laser electrode and applying the second laser current $I_2$ to the second segment of the waveguide through the second laser electrode, thereby producing the laser output to propagate along the waveguide; (B) operating the laser-control electrical circuit so as to direct the wavelength-control current $I_{WC}$ to flow through one or both of the first or second laser electrodes and thereby control and stabilize the laser wavelength; and (C) operating the power-control electrical circuit so as to reduce amplitude noise of the laser output.

It is intended that equivalents of the disclosed example embodiments and methods shall fall within the scope of the present disclosure or appended claims. It is intended that the disclosed example embodiments and methods, and equivalents thereof, may be modified while remaining within the scope of the present disclosure or appended claims.

In the foregoing Detailed Description, various features may be grouped together in several example embodiments for the purpose of streamlining the disclosure. This method of disclosure is not to be interpreted as reflecting an intention that any claimed embodiment requires more features than are expressly recited in the corresponding claim. Rather, as the appended claims reflect, inventive subject matter may lie in less than all features of a single disclosed example embodiment. Thus, the appended claims are hereby incorporated into the Detailed Description, with each claim standing on its own as a separate disclosed embodiment. However, the present disclosure shall also be construed as implicitly disclosing any embodiment having any suitable set of one or more disclosed or claimed features (i.e., a set of features that are neither incompatible nor mutually exclusive) that appear in the present disclosure or the appended claims, including those sets that may not be explicitly disclosed herein. In addition, for purposes of disclosure, each of the appended dependent claims shall be construed as if written in multiple dependent form and dependent upon all preceding claims with which it is not inconsistent. It should be further noted that the scope of the appended claims does not necessarily encompass the whole of the subject matter disclosed herein.

For purposes of the present disclosure and appended claims, the conjunction "or" is to be construed inclusively (e.g., "a dog or a cat" would be interpreted as "a dog, or a cat, or both"; e.g., "a dog, a cat, or a mouse" would be interpreted as "a dog, or a cat, or a mouse, or any two, or all three"), unless: (i) it is explicitly stated otherwise, e.g., by use of "either . . . or," "only one of," or similar language; or (ii) two or more of the listed alternatives are mutually exclusive within the particular context, in which case "or" would encompass only those combinations involving non-mutually-exclusive alternatives. For purposes of the present disclosure and appended claims, the words "comprising," "including," "having," and variants thereof, wherever they appear, shall be construed as open ended terminology, with the same meaning as if the phrase "at least" were appended after each instance thereof, unless explicitly stated otherwise. For purposes of the present disclosure or appended claims, when terms are employed such as "about equal to," "substantially equal to," "greater than about," "less than about," and so forth, in relation to a numerical quantity, standard conventions pertaining to measurement precision and significant digits shall apply, unless a differing interpretation is explicitly set forth. For null quantities described by phrases such as "substantially prevented," "substantially absent," "substantially eliminated," "about equal to zero," "negligible," and so forth, each such phrase shall denote the case wherein the quantity in question has been reduced or diminished to such an extent that, for practical purposes in the context of the intended operation or use of the disclosed or claimed apparatus or method, the overall behavior or performance of the apparatus or method does not differ from that which would have occurred had the null quantity in fact been completely removed, exactly equal to zero, or otherwise exactly nulled.

For purposes of the present disclosure and appended claims, any labelling of elements, steps, limitations, or other portions of an embodiment, example, or claim (e.g., first, second, etc., (a), (b), (c), etc., or (i), (ii), (iii), etc.) is only for purposes of clarity, and shall not be construed as implying any sort of ordering or precedence of the portions so labelled. If any such ordering or precedence is intended, it will be explicitly recited in the embodiment, example, or claim or, in some instances, it will be implicit or inherent based on the specific content of the embodiment, example, or claim. In the appended claims, if the provisions of 35 USC § 112(f) are desired to be invoked in an apparatus claim, then the word "means" will appear in that apparatus claim. If those provisions are desired to be invoked in a method claim, the words "a step for" will appear in that method claim. Conversely, if the words "means" or "a step for" do not appear in a claim, then the provisions of 35 USC § 112(f) are not intended to be invoked for that claim.

If any one or more disclosures are incorporated herein by reference and such incorporated disclosures conflict in part or whole with, or differ in scope from, the present disclosure, then to the extent of conflict, broader disclosure, or broader definition of terms, the present disclosure controls. If such incorporated disclosures conflict in part or whole with one another, then to the extent of conflict, the later-dated disclosure controls.

The Abstract is provided as required as an aid to those searching for specific subject matter within the patent literature. However, the Abstract is not intended to imply that any elements, features, or limitations recited therein are necessarily encompassed by any particular claim. The scope of subject matter encompassed by each claim shall be determined by the recitation of only that claim.

What is claimed is:

1. A semiconductor laser source comprising:
   (a) a semiconductor substrate;
   (b) an optical waveguide formed on the substrate and arranged so as to provide position-dependent optical gain or loss, for an optical signal that propagates along the waveguide within an operating wavelength range of the laser source, that varies according to a position-dependent level of electrical current density flowing into or out of the optical waveguide;
   (c) an optical reflector arranged on the substrate or waveguide so as to reflect, to propagate along the optical waveguide in a forward direction, at least a portion of an optical signal propagating along the waveguide in a rearward direction within the operating wavelength range;
   (d) an optical grating arranged on the substrate or waveguide so as to diffract, to propagate in the rearward direction along the waveguide toward the reflector, at least a portion of an optical signal propagating along the waveguide in the forward direction within the operating wavelength range, wherein the waveguide, reflector, and grating define a laser resonator arranged so that laser output from the laser resonator propagates (i) in the forward direction from the grating along the waveguide, (ii) in the rearward direction from the optical reflector, or (iii) in both directions, the laser output being characterized by a laser wavelength;
   (e) a first laser electrode positioned over a first segment, of length $L_1$, of the waveguide between the reflector and the grating, the first laser electrode being arranged so as to enable a substantially constant first laser current $I_1$ to flow through the first laser electrode into the first segment of the waveguide and produce optical gain therein;
   (f) a second laser electrode positioned over a second segment, of length $L_2$, of the waveguide that includes at least a portion of the grating, the second laser electrode being arranged so as to enable a substantially constant second laser current $I_2$ to flow through the second laser electrode into the second segment of the waveguide and produce optical gain therein;
   (g) an optical detector and a wavelength discriminator, with the wavelength discriminator being arranged so as to direct a wavelength-dependent fraction of the laser output onto the optical detector so as to generate therefrom a laser-wavelength electrical signal; and
   (h) a laser-control electrical circuit coupling the optical detector and one or both of the first or second laser electrodes in a feedback arrangement operative to control and stabilize the laser wavelength relative to a wavelength-dependent property of the wavelength discriminator, wherein the laser-control electrical circuit is arranged so as to (i) derive from the laser-wavelength electrical signal a wavelength-control current $I_{WC}$, (ii) direct the first laser current $I_1$ to flow through the first laser electrode, (iii) direct the second laser current $I_2$ to flow through the second laser electrode, and (iv) direct the wavelength-control current $I_{WC}$ to flow through one or both of the first or second laser electrodes.

2. The laser source of claim 1 wherein no portion of the optical grating lies below the first laser electrode.

3. The laser source of claim 2 wherein the optical grating lies entirely below the second laser electrode.

4. The laser source of claim 1 wherein the laser-control electrical circuit is arranged so as to direct the wavelength-control current $I_{WC}$ to flow through one or both of the first or second laser electrodes in accordance with only one of: (i) a total current $I_1+I_{WC}$ flows into the first segment of the waveguide and a total current $I_2$ flows into the second segment of the waveguide; (ii) a total current $I_1+I_{WC}$ flows into the first segment of the waveguide and a total current $I_2-I_{WC}$ flows into the second segment of the waveguide; (iii) a total current $I_1$ flows into the first segment of the waveguide and a total current $I_2+I_{WC}$ flows into the second segment of the waveguide; and (iv) a total current $I_1-I_{WC}$ flows into the first segment of the waveguide and a total current $I_2+I_{WC}$ flows into the second segment of the waveguide.

5. The laser source of claim 1 wherein either: (i) a current density $I_1/L_1$ is less than a current density $I_2/L_2$, so that the current density $I_1/L_1$ results in the optical gain of the first segment of the waveguide being about zero or varying substantially linearly with respect to the current density $I_1/L_1$ and so that the current density $I_2/L_2$ results in the optical gain of the second segment of the waveguide being at least partly saturated with respect to the current density $I_2/L_2$; or (ii) a current density $I_1/L_1$ is greater than a current density $I_2/L_2$, so that the current density $I_1/L_1$ results in the optical gain of the first segment of the waveguide being at least partly saturated with respect to the current density $I_1/L_1$ and so that the current density $I_2/L_2$ results in the optical gain of the second segment of the waveguide being about zero or varying substantially linearly with respect to the current density $I_2/L_2$.

6. The laser source of claim 1 wherein the laser resonator, the laser-control electrical circuit, and the first and second laser electrodes are arranged and connected so that operation of the feedback arrangement results in reduced phase noise of the laser output, relative to operation of the laser source without operation of the feedback arrangement, at offset frequencies exceeding about $1.0 \times 10^6$ Hz.

7. The laser source of claim 1 wherein the laser-control circuit includes an electrical low-pass filter, and the electrical low-pass filter is arranged so as to attenuate generation of the wavelength-control current $I_{WC}$ at wavelength-modulation frequencies above about $1.0 \times 10^7$ Hz.

8. The laser source of claim 1 wherein one or both of the wavelength discriminator or the optical detector are integrated onto the semiconductor substrate.

9. The laser source of claim 1 wherein the wavelength discriminator exhibits a wavelength-dependent reflection or transmission spectrum, and includes one or more of an optical low-pass filter, an optical high-pass filter, and optical bandpass filter, an optical notch-filter, a Fabry-Perot resonator, an optical interferometer, an optical grating, a fiber grating, an atomic or molecular absorption or emission line, or a spectroscopic feature.

10. The laser source of claim 1 wherein one or both of the wavelength discriminator or the laser-control circuit are arranged so as to sweep the laser wavelength.

11. The laser source of claim 10 wherein one or both of the wavelength discriminator or the laser-control circuit are arranged so as to sweep the laser wavelength over a wavelength range equivalent to an optical frequency range greater than about 1.0 GHz.

12. The laser source of claim 10 wherein one or both of the wavelength discriminator or the laser-control circuit are arranged so as to sweep the laser wavelength at a wavelength sweep rate equivalent to a laser optical frequency sweep rate greater than about than about 0.10 GHz/µs.

13. The laser source of claim 10 wherein the sweep of the laser wavelength results in sweep of the laser optical frequency that is substantially linear with respect to time.

14. The laser source of claim 10 wherein wavelength-dependent properties of the wavelength discriminator are substantially fixed.

15. The laser source of claim 14 wherein the wavelength discriminator exhibits a substantially fixed wavelength-dependent reflection or transmission spectrum, and includes one or more of an optical low-pass filter, an optical high-pass filter, and optical bandpass filter, an optical notch-filter, a Fabry-Perot resonator, an optical interferometer, an optical grating, a fiber grating, an atomic or molecular absorption or emission line, or a spectroscopic feature.

16. The laser source of claim 10 wherein the wavelength discriminator is arranged so as to exhibit one or more variable wavelength-dependent properties, and the wavelength discriminator and the laser-control circuit are arranged so as to sweep the laser wavelength according to sweeping of one or more of the one or more variable wavelength-dependent properties of the wavelength discriminator.

17. The laser source of claim 16 wherein the wavelength discriminator exhibits a variable wavelength-dependent reflection or transmission spectrum, and includes one or more of an optical low-pass filter, an optical high-pass filter, an optical bandpass filter, an optical notch-filter, a Fabry-Perot resonator, an optical interferometer, an optical grating, a fiber grating, an atomic or molecular absorption or emission line, or a spectroscopic feature.

18. The laser source of claim 16 wherein the wavelength discriminator includes a tunable Fabry-Perot resonator, and the laser-control circuit is arranged so as to sweep the laser wavelength according to sweeping a reflection or transmission spectrum of the tunable Fabry-Perot resonator.

19. The laser source of claim 18 wherein the tunable Fabry-Perot resonator includes a Fabry-Perot waveguide segment incorporating one or more electro-optic materials in, on, or near the Fabry-Perot waveguide segment and arranged so as to alter resonant optical frequencies of the Fabry-Perot resonator in response to a wavelength-sweep control signal applied to the Fabry-Perot waveguide segment that alters a refractive index of the electro-optic material.

20. The laser source of claim 18 wherein the tunable Fabry-Perot resonator includes a Fabry-Perot waveguide segment incorporating one or more semiconductor materials in, on, or near the Fabry-Perot waveguide segment and arranged so as to alter resonant optical frequencies of the Fabry-Perot resonator in response to a wavelength-sweep control signal applied to the Fabry-Perot waveguide segment that alters an electric current density flowing through the Fabry-Perot waveguide segment.

21. The laser source of claim 1 further comprising:
(i) an optical modulator arranged to modulate transmitted power of the laser output;
(j) a second optical detector arranged so as to receive a fraction of the transmitted power so as to generate therefrom a laser-power electrical signal; and
(k) a power-control electrical circuit coupling the second optical detector and the optical modulator so as to (i) generate from the laser-power electrical signal a power-control electrical signal, (ii) apply the power-control electrical signal to the optical modulator and thereby alter the transmitted power, and (iii) operate as a laser-amplitude-noise-reduction feedback mechanism.

22. The laser source of claim 21 wherein:
(i) the optical modulator comprises a modulator optical waveguide formed on a modulator semiconductor substrate and a modulator electrode positioned over at least a portion of the modulator waveguide;
(ii) the modulator waveguide is arranged so as to receive at least a portion of the laser output to propagate along the modulator waveguide; and
(iii) the power-control electrical circuit applies the laser-power electrical signal to the optical modulator by deriving from the laser-power electrical signal a power-modulation current, and directing the power-modulation current through the modulator electrode into or out of the modulator waveguide so as to alter optical gain or loss of the laser output propagating along the modulator waveguide.

23. The laser source of claim 22 wherein the laser and modulator substrates form a single, common substrate, and the laser and modulator waveguides form a single, common waveguide.

24. The laser source of claim 21 wherein the laser-control electrical circuit includes the power-control electrical circuit.

25. A method for operating the laser source of claim 1, the method comprising:
(A) applying the first laser current $I_1$ to the first segment of the waveguide through the first laser electrode and applying the second laser current $I_2$ to the second segment of the waveguide through the second laser electrode, thereby producing the laser output to propagate along the waveguide; and
(B) operating the laser-control electrical circuit so as to direct the wavelength-control current $I_{WC}$ to flow through one or both of the first or second laser electrodes and thereby control and stabilize the laser wavelength.

26. A method for operating the laser source of claim 10, the method comprising:
(A) applying the first laser current $I_1$ to the first segment of the waveguide through the first laser electrode and applying the second laser current $I_2$ to the second segment of the waveguide through the second laser electrode, thereby producing the laser output to propagate along the waveguide; and (B) operating the wavelength discriminator or the laser-control electrical circuit so as to direct the wavelength-control current $I_{WC}$ to flow through one or both of the first or second laser electrodes and thereby control, stabilize, and sweep the laser wavelength.

27. A method for operating the laser source of claim 16, the method comprising:

(A) applying the first laser current $I_1$ to the first segment of the waveguide through the first laser electrode and applying the second laser current $I_2$ to the second segment of the waveguide through the second laser electrode, thereby producing the laser output to propagate along the waveguide; and (B) sweeping one or more of the one or more variable wavelength-dependent properties of the wavelength discriminator and operating the laser-control electrical circuit so as to direct the wavelength-control current $I_{WC}$ to flow through one or both of the first or second laser electrodes and thereby control, stabilize, and sweep the laser wavelength.

28. A method for operating the laser source of claim 21, the method comprising:

(A) applying the first laser current $I_1$ to the first segment of the waveguide through the first laser electrode and applying the second laser current $I_2$ to the second segment of the waveguide through the second laser electrode, thereby producing the laser output to propagate along the waveguide;

(B) operating the laser-control electrical circuit so as to direct the wavelength-control current $I_{WC}$ to flow through one or both of the first or second laser electrodes and thereby control and stabilize the laser wavelength; and (C) operating the power-control electrical circuit so as to reduce amplitude noise of the laser output.

29. A semiconductor laser source comprising:

(a) a semiconductor substrate;

(b) an optical waveguide formed on the substrate and arranged so as to provide position-dependent optical gain or loss, for an optical signal that propagates along the waveguide within an operating wavelength range of the laser source, that varies according to a position-dependent level of electrical current density flowing into or out of the optical waveguide;

(c) one or more optical reflectors or one or more optical gratings arranged on the substrate or waveguide so as to define along the waveguide a laser resonator arranged so that laser output from the laser resonator propagates along the waveguide away from the laser resonator in a forward direction, in a rearward direction, or in both directions, the laser output being characterized by a laser wavelength;

(d) one or more laser electrodes positioned over one or more corresponding segments of the laser resonator, each laser electrode being arranged so as to enable a corresponding laser current or wavelength control current to flow therethrough and into or out of the corresponding segment of the laser resonator;

(e) an optical detector and a wavelength discriminator, with the wavelength discriminator being arranged so as to direct a wavelength-dependent fraction of the laser output onto the optical detector so as to generate therefrom a laser-wavelength electrical signal; and (f) a laser-control electrical circuit coupling the optical detector and one or more of the one or more laser electrodes in a feedback arrangement operative to control and stabilize the laser wavelength relative to a wavelength-dependent property of the wavelength discriminator, wherein:

(g) the laser-control electrical circuit is arranged so as to (i) derive from the laser-wavelength electrical signal a wavelength-control current $I_{WC}$, (ii) direct a corresponding substantially constant laser current to flow through each laser electrode, and (iii) direct the wavelength-control current $I_{WC}$ to flow through one or more of the one or more laser electrodes;

(h) the wavelength discriminator and the laser-control circuit are arranged so as to sweep the laser wavelength; and (i) the wavelength discriminator is arranged so as to exhibit one or more variable wavelength-dependent properties; and (j) the wavelength discriminator and the laser-control circuit are arranged so as to sweep the laser wavelength according to sweeping of one or more of the one or more variable wavelength-dependent properties of the wavelength discriminator.

30. The laser source of claim 29 wherein the wavelength discriminator exhibits a variable wavelength-dependent reflection or transmission spectrum, and includes one or more of an optical low-pass filter, an optical high-pass filter, an optical bandpass filter, an optical notch-filter, a Fabry-Perot resonator, an optical interferometer, an optical grating, a fiber grating, an atomic or molecular absorption or emission line, or a spectroscopic feature.

31. The laser source of claim 29 wherein the wavelength discriminator includes a tunable Fabry-Perot resonator; and the laser-control circuit is arranged so as to sweep the laser wavelength according to sweeping a reflection or transmission spectrum of the tunable Fabry-Perot resonator.

32. The laser source of claim 31 wherein either:

(i) the tunable Fabry-Perot resonator includes a Fabry-Perot waveguide segment incorporating one or more electro-optic materials in, on, or near the Fabry-Perot waveguide segment and arranged so as to alter resonant optical frequencies of the Fabry-Perot resonator in response to a wavelength-sweep control signal applied to the Fabry-Perot waveguide segment that alters a refractive index of the electro-optic material; or (ii) the tunable Fabry-Perot resonator includes a Fabry-Perot waveguide segment incorporating one or more semiconductor materials in, on, or near the Fabry-Perot waveguide segment and arranged so as to alter resonant optical frequencies of the Fabry-Perot resonator in response to a wavelength-sweep control signal applied to the Fabry-Perot waveguide segment that alters an electric current density flowing through the Fabry-Perot waveguide segment.

33. The laser source of claim 29 wherein the sweep of the laser wavelength results in sweep of the laser optical frequency that is substantially linear with respect to time.

34. A method for operating the laser source of claim 29, the method comprising:

(A) applying the one or more laser currents to the corresponding one or more segments of the laser resonator through the one or more corresponding laser electrodes, thereby producing the laser output to propagate along the waveguide; and (B) sweeping one or more of the one or more variable wavelength-dependent properties of the wavelength discriminator and operating the laser-control electrical circuit so as to direct the wavelength-control current $I_{WC}$ to flow through one or both of the first or second laser electrodes and thereby control, stabilize, and sweep the laser wavelength.

\* \* \* \* \*